(12) United States Patent
You et al.

(10) Patent No.: US 10,136,527 B2
(45) Date of Patent: Nov. 20, 2018

(54) POWER CONVERSION DEVICE

(71) Applicant: Delta Electronics (Shanghai) Co., Ltd., Shanghai (CN)

(72) Inventors: Pei-Ai You, Shanghai (CN); Gang Liu, Shanghai (CN); Jin-Fa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 108 days.

(21) Appl. No.: 15/200,006

(22) Filed: Jul. 1, 2016

(65) Prior Publication Data
US 2017/0127540 A1     May 4, 2017

(30) Foreign Application Priority Data
Oct. 29, 2015    (CN) .......................... 2015 1 0718990

(51) Int. Cl.
| | |
|---|---|
| *H05K 5/00* | (2006.01) |
| *H05K 7/14* | (2006.01) |
| *H02M 1/44* | (2007.01) |
| *H02M 7/00* | (2006.01) |
| *H05K 1/18* | (2006.01) |
| *H05K 5/04* | (2006.01) |
| *H05K 7/20* | (2006.01) |

(Continued)

(52) U.S. Cl.
CPC ............ *H05K 5/0026* (2013.01); *H02M 1/44* (2013.01); *H02M 7/003* (2013.01); *H05K 1/181* (2013.01); *H05K 5/0004* (2013.01); *H05K 5/04* (2013.01); *H05K 7/1417* (2013.01); *H05K 7/1432* (2013.01); *H05K 7/20245* (2013.01); *H05K 9/0007* (2013.01); *B60L 11/18* (2013.01); *H05K 2201/10174* (2013.01)

(58) Field of Classification Search
CPC ...... H05K 5/0026; H05K 5/0004; H05K 5/04; H05K 7/20245; H05K 1/181; H05K 7/1417; H05K 9/0007; H05K 2201/10174; H02M 7/003; H02M 1/44
See application file for complete search history.

(56) References Cited

U.S. PATENT DOCUMENTS

| | | | |
|---|---|---|---|
| 8,169,780 B2 | 5/2012 | Yoshino et al. | |
| 9,608,528 B2 * | 3/2017 | Nakazawa | ........ H02M 3/33576 |

(Continued)

FOREIGN PATENT DOCUMENTS

| | | | |
|---|---|---|---|
| CN | 102386593 A | 3/2012 | |
| CN | 103296863 A | 9/2013 | |

(Continued)

*Primary Examiner* — Hoa C Nguyen
*Assistant Examiner* — Christopher L Augustin
(74) *Attorney, Agent, or Firm* — CKC & Partners Co., Ltd.

(57) ABSTRACT

A power conversion device includes a casing, a structural plate, a converter module, an auxiliary circuit board module and a top cover. The casing includes a base plate and a side wall, and the base plate and the side wall form a chamber. The structural plate is located in the chamber. The converter module is located between the base plate and the structural plate. The auxiliary circuit board module is located at a side of the structural plate in the chamber away from the base plate, and is electrically connected with the converter module. The top cover seals the chamber.

15 Claims, 20 Drawing Sheets

(51) Int. Cl.
*H05K 9/00* (2006.01)
*B60L 11/18* (2006.01)

(56) References Cited

U.S. PATENT DOCUMENTS

| | | | | |
|---|---|---|---|---|
| 2010/0097765 | A1* | 4/2010 | Suzuki | B60K 6/365 |
| | | | | 361/699 |
| 2011/0051371 | A1 | 3/2011 | Azuma et al. | |
| 2015/0214857 | A1* | 7/2015 | Kosuga | H02M 7/003 |
| | | | | 318/400.26 |
| 2015/0256096 | A1* | 9/2015 | Nishizawa | H01G 2/04 |
| | | | | 363/131 |
| 2015/0357923 | A1 | 12/2015 | Nakazawa et al. | |

FOREIGN PATENT DOCUMENTS

| | | |
|---|---|---|
| CN | 105101744 A | 11/2015 |
| EP | 2876985 A2 | 5/2015 |
| TW | 201336211 A | 9/2013 |

* cited by examiner

POWER CONVERSION DEVICE

RELATED APPLICATIONS

This application claims priority to Chinese Application Serial Number 201510718990.7, filed Oct. 29, 2015, which is herein incorporated by reference.

BACKGROUND

Technical Field

The present disclosure relates to power conversion devices. More particularly, the present disclosure relates to vehicle power conversion devices.

Description of Related Art

With notable features such as high efficiency, energy savings, low noise and zero emissions, electric vehicles have incomparable advantages in the aspects of energy savings and environmental protection. In recent years around the world, there has been significant progress of the core and key technologies for electric vehicles, such as batteries, motors, control systems and on board charger module (OBCM). Product safety, reliability and working life has also been enhanced, as well as better cost control for the product cost. Hybrid electric vehicles and pure electric vehicles are gradually approaching to a stage of practicality and small industrialization. Electric vehicles will be a strategic direction for the development of the automotive industry all over the world.

As one of the important components of electric vehicles, OBCM for electric vehicles are a kind of power conversion device. By connecting to an alternating current from a power grid through input wires, it generates a direct current of a high voltage through an output wires to charge the high voltage battery pack carried on a vehicle. In addition, it keeps the mutual communication in real time with the battery management system (BMS) through its own communication port. The enhancement of the overall performance and the cost control of the OBCM is one of the major factors constraining the production of electric vehicles in a massive scale. Meanwhile, the electric performance, the structural design and the level of heat management are key criteria to comprehensively evaluate and measure the performance of the OBCM.

SUMMARY

A technical aspect of the present disclosure provides a power conversion device, in which the elements are closely disposed though the pattern of stacking, so as to effectively reduce the overall dimensions of the power conversion device.

According to an embodiment of the present disclosure, a power conversion device includes a casing, a structural plate, a converter module, an auxiliary circuit board module and a top cover. The casing includes a base plate and a side wall, and the base plate and the side wall form a chamber. The structural plate is located in the chamber. The converter module is located between the base plate and the structural plate. The auxiliary circuit board module is located at a side of the structural plate in the chamber away from the base plate, and is electrically connected with the converter module. The top cover seals the chamber.

In one or more embodiments of the present disclosure, the converter module comprises a plurality of converters.

In one or more embodiments of the present disclosure, each of the converters has a loading capacity. The auxiliary circuit board module includes an output board. The output board is configured to sum up the loading capacity of at least one of the converters into a loading capacity of the power conversion device.

In one or more embodiments of the present disclosure, the phase of a voltage of an alternative current of an input side of each of the converters is different from each other.

In one or more embodiments of the present disclosure, the phase of a voltage of an alternative current of an input side of each of the converters is the same as each other.

In one or more embodiments of the present disclosure, the auxiliary circuit board module comprises an electromagnetic interference control board.

In one or more embodiments of the present disclosure, the base plate includes an accommodation space. Each of the converters includes a magnetic element and a printed circuit board. Each of the magnetic elements is electrically connected to the corresponding printed circuit board. Each of the magnetic elements is located between the corresponding printed circuit board and the base plate. Each of the magnetic elements is fixed in the accommodation space.

In one or more embodiments of the present disclosure, the power conversion device further includes at least one strut and at least one fastener. The strut includes an insulating column, at least one terminal and at least one connecting piece. An end of the insulating column is connected with the base plate. The terminal is located at another end of the insulating column. The connecting piece is electrically connected to the terminal. The fastener fastens together the connecting piece, the terminal and the insulating column.

In one or more embodiments of the present disclosure, the power conversion device includes at least one strut and at least one fastener. The strut fastens the converter module and the base plate. The strut includes an insulating column and at least one terminal. An end of the insulating column is connected with the base plate. Another end of the insulating column supports the converter module. The terminal is located between the insulating column and the converter module. The converter module has at least one connecting end. The connecting end is electrically connected with the terminal. The fastener fastens together the converter module, the terminal and the insulating column.

In one or more embodiments of the present disclosure, the converter module and the auxiliary circuit board module are disposed back to back.

In one or more embodiments of the present disclosure, the auxiliary circuit board module includes at least one printed circuit board and at least one electronic element. The electronic element is arranged on the printed circuit board, and the electronic element is located between the printed circuit board and the top cover.

In one or more embodiments of the present disclosure, the converter module includes at least one printed circuit board and at least one electronic element. The electronic element is arranged on the printed circuit board, and the electronic element is located between the printed circuit board and the base plate.

In one or more embodiments of the present disclosure, the converter module further includes a secondary side rectifier diode. The secondary side rectifier diode is arranged on the printed circuit board, and the secondary side rectifier diode is located between the printed circuit board and the base plate.

In one or more embodiments of the present disclosure, the converter module further includes a magnetic element. The magnetic element is electrically connected with the printed circuit board, and the magnetic element is located between the printed circuit board and the base plate.

In one or more embodiments of the present disclosure, the structural plate is of a metallic material.

In one or more embodiments of the present disclosure, two sides of the structural plate are affixed with insulating material.

When compared with the prior art, the above-mentioned embodiments of the present disclosure have at least the following advantage: in one embodiment of the present disclosure as mentioned above, the converter module is located between the base plate and the structural plate. The auxiliary circuit board module is located at a side of the structural plate away from the base plate, and is electrically connected with the converter module. Therefore, the arrangement of the auxiliary circuit board module and the converter module can be closely disposed, so as to effectively reduce the overall dimensions of the power conversion device.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
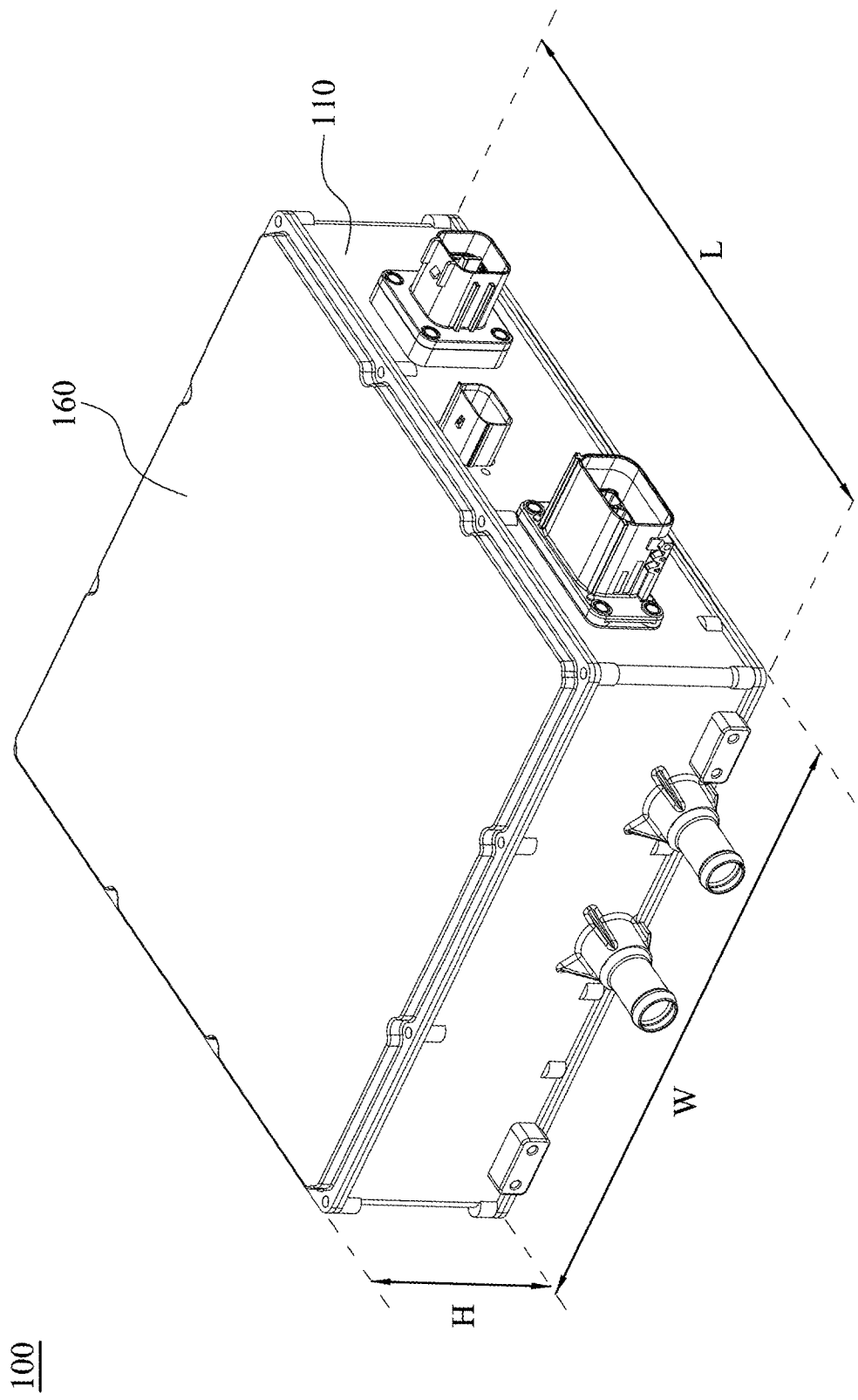
FIG. 1 is a schematic perspective view of a power conversion device according to an embodiment of the present disclosure.

Drawings will be used below to disclose a plurality of embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In this embodiment, the power conversion device includes a converter module and an auxiliary circuit board module. The auxiliary circuit board module includes an electromagnetic interference control board, an output board and a low voltage circuit board. However, this does not intend to limit the present disclosure. Each of the parts, input and output of the power conversion device can all be designed according to the actual engineering requirements.

Figure 2:
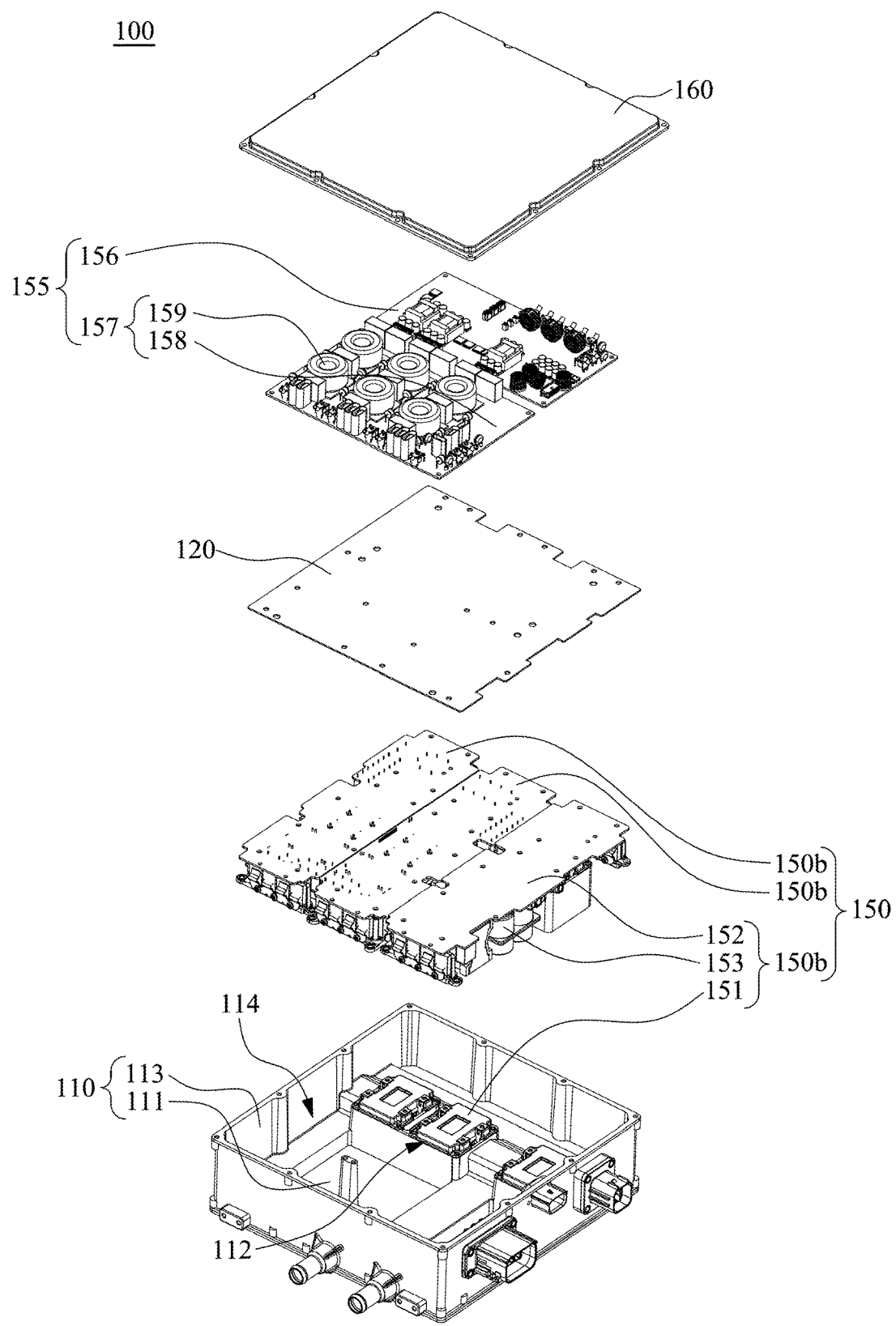
FIG. 2 is an exploded top view of the power conversion device of FIG. 1.
Figure 3:
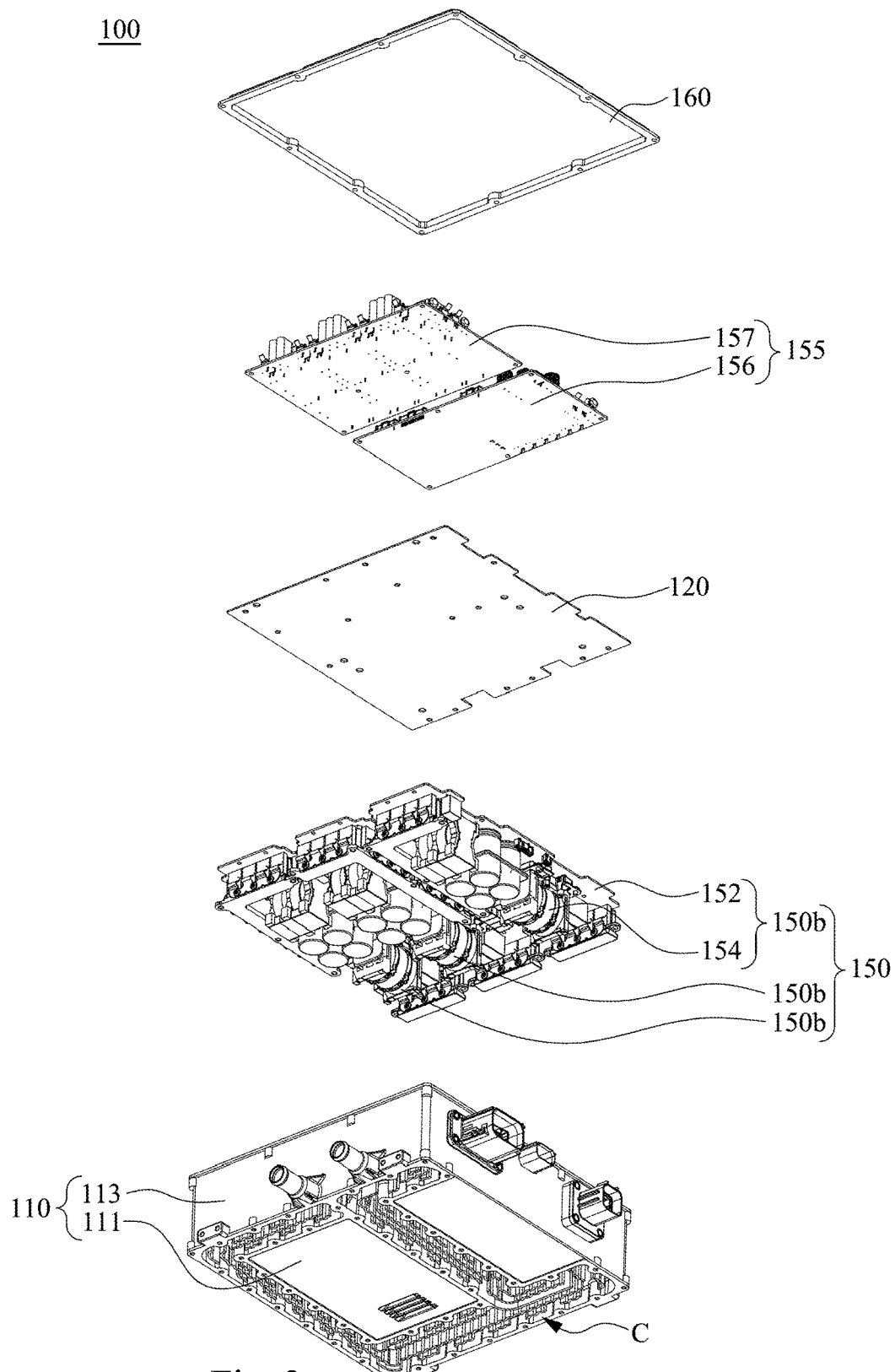
FIG. 3 is an exploded bottom view of the power conversion device of FIG. 1.

To be more specific, reference is made to FIGS. 1-3. FIG. 1 is a schematic perspective view of a power conversion device 100 according to an embodiment of the present disclosure. FIG. 2 is an exploded top view of the power conversion device 100 of FIG. 1. FIG. 3 is an exploded bottom view of the power conversion device 100 of FIG. 1. As shown in FIGS. 1-3, a power conversion device 100 includes a casing 110, a structural plate 120, a converter module 150, an auxiliary circuit board module 155 and a top cover 160. The casing 110 includes a base plate 111 and a side wall 113, and the base plate 111 and the side wall 113 form a chamber 114. The structural plate 120 is located in the chamber 114. The converter module 150 is located between the base plate 111 and the structural plate 120. The auxiliary circuit board module 155 is located at a side of the structural plate 120 in the chamber 114 away from the base plate 111, and is electrically connected with the converter module 150. The top cover 160 seals the chamber 114.

In other words, the auxiliary circuit board module 155 is disposed at a side of the structural plate 120 away from the base plate 111 in a pattern of stacking. In this way, the arrangement of the auxiliary circuit board module 155 and the converter module 150 can be closely disposed, so as to effectively reduce the overall dimensions of the power conversion device 100. For example, the overall dimensions of the power conversion device 100 such as length L×width W×height H can be 328 mm×316 mm×103 mm. However, this does not intend to limit the present disclosure.

In addition, as shown in FIGS. 2-3, the converter module 150 and the auxiliary circuit board module 155 are disposed back to back. The converter module 150 faces to the base plate 111. The auxiliary circuit board module 155 faces to the top cover 160. In this embodiment, as shown in FIG. 3, a side of the base plate 111 away from the converter module 150 is disposed a coolant channel C. In this way, since they are mainly high power devices on the converter module 150, the high power devices being close to the base plate 111 can facilitate the cooling of the converter module 150.

To be more specific, in practical applications, the converter module 150 includes a converter 150b. The converter 150b includes a printed circuit board 152 and an electronic element 153. The electronic element 153 is arranged on the printed circuit board 152, and the electronic element 153 is close to the base plate 111, i.e., the electronic element 153 is located between the printed circuit board 152 and the base plate 111. The converter 150b further includes a secondary side rectifier diode 154. The secondary side rectifier diode 154 is arranged on the printed circuit board 152, and the secondary side rectifier diode 154 is close to the base plate 111, i.e., the secondary side rectifier diode 154 is located between the printed circuit board 152 and the base plate 111 to substantially enhance the effect of heat dissipation.

Relatively speaking, the auxiliary circuit board module 155 includes a printed circuit board 158 and an electronic element 159. The electronic element 159 is arranged on the printed circuit board 158, and the electronic element 159 is close to the top cover 160, i.e., the electronic element 159 is located between the printed circuit board 158 and the top cover 160. In practical applications, the electronic elements 159 on the auxiliary circuit board module 155 are mainly low power device. The lower power devices are close to the top cover 160, and heat dissipation is carried out through the top cover 160. Furthermore, the back to back disposition of the converter module 150 and the auxiliary circuit board module 155 can shorten the length of the connecting wire, which effectively reducing noise interference. In one embodiment, the converter module 150 and the auxiliary circuit board module 155 can be disposed in a way other than the back to back disposition. For example, the electronic element 159 of the auxiliary circuit board module 155 can also be close to the structural plate 120, and/or the electronic element 153 of the converter module 150 can also be close to the structural plate 120.

In one embodiment, the structural plate 120 is of a metallic material, and two sides of the structural plate 120 are affixed with insulating material. In this way, the structural plate 120 can support the auxiliary circuit board module 155. Moreover, with an effect of heat dissipation, the insulation between the solder on the converter module 150 and the solder on the auxiliary circuit board module 155 can be implemented.

On the other hand, the converter module 150 includes a plurality of converters 150b. To be more specific, in this embodiment, as shown in FIG. 2, the quantity of the converters 150b is three, and each of the converters 150b includes a magnetic element 151, the printed circuit board 152, the electronic element 153 and the secondary side rectifier diode 154. The magnetic element 151 is electrically connected with the printed circuit board 152. In this embodiment, since the magnetic element 151 is of substantial volume and possesses heavy weight, which dissipates relatively more heat, the magnetic element 151 is disposed closer to the base plate 111 relative to the printed circuit board 152. The magnetic element 151 is located between the printed circuit board 152 and the base plate 111. Particularly, the magnetic element 151 can be fixed in the accommodation space 112 of the base plate 111, facilitating the heat dissipation and the positioning of the magnetic element 151.

In order to overcome the electromagnetic interference generated during the operation of the power conversion device 100, the auxiliary circuit board module 155 includes an electromagnetic interference control board 157. The electromagnetic interference control board 157 includes the printed circuit board 158 and the electronic element 159. The electromagnetic interference control board 157 is electrically connected with the printed circuit board 152, so as to work with the converter module 150 to effectively accomplish the power conversion.

In practical applications, according to actual situations, one of the converters 150b of the converter module 150 can be configured as the master board, and the other two converters 150b can be configured as the slave boards as controlled by the master board. It is noted that the quantity of the converters 150b as cited herein is only illustrative and is not to limit the claimed scope. A person having ordinary skill in the art of the present disclosure may appropriately determine the quantity of the converters 150b depending on actual situations. Each of the converters 150b can be symmetric or asymmetric.

To be more specific, each of the converters 150b has a loading capacity. In this embodiment, as shown in FIGS. 2-3, the auxiliary circuit board module 155 further includes an output board 156. The output board 156 is configured to sum up the loading capacity of at least one of the converters 150b into a loading capacity of the power conversion device 100. However, this does not intend to limit the present disclosure. For example, the loading capacity of all the converters 150b of the converter module 150 can be summed up into the loading capacity of the power conversion device 100. On the other hand, the loading capacity of a part of the converters 150b can be summed up into the loading capacity of the power conversion device 100, while the loading capacity of at least one of the converters 150b can be regarded as a redundant loading capacity.

On the other hand, an input side of the converter module 150 can be a single-phase alternative current, or a three-phase alternative current. When the input is of the single-phase alternative current, the phase of a voltage of the alternative current of the input side of each of the converters 150b is the same as each other. When the input is of the three-phase alternative current, the phase of a voltage of the alternative current of the input side of each of the converters 150b is different from each of the others.

Figure 4:
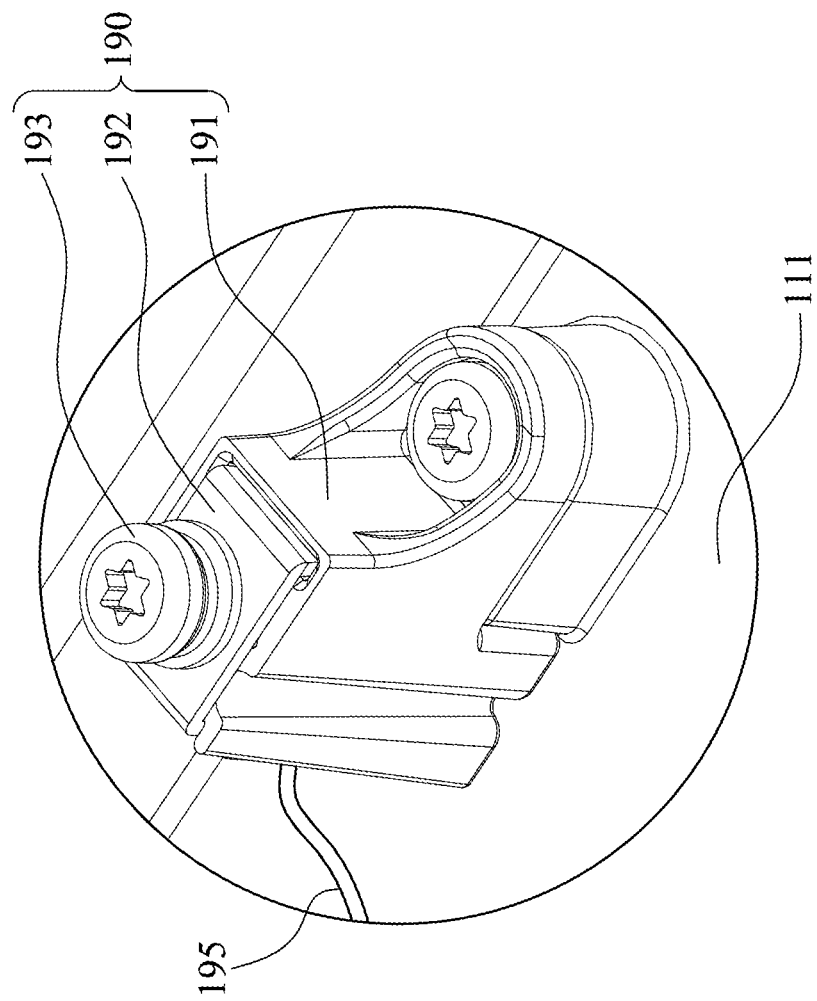
FIGS. 4-6 are partially enlarged views of the strut of the power conversion device of FIG. 1.
Figure 5:
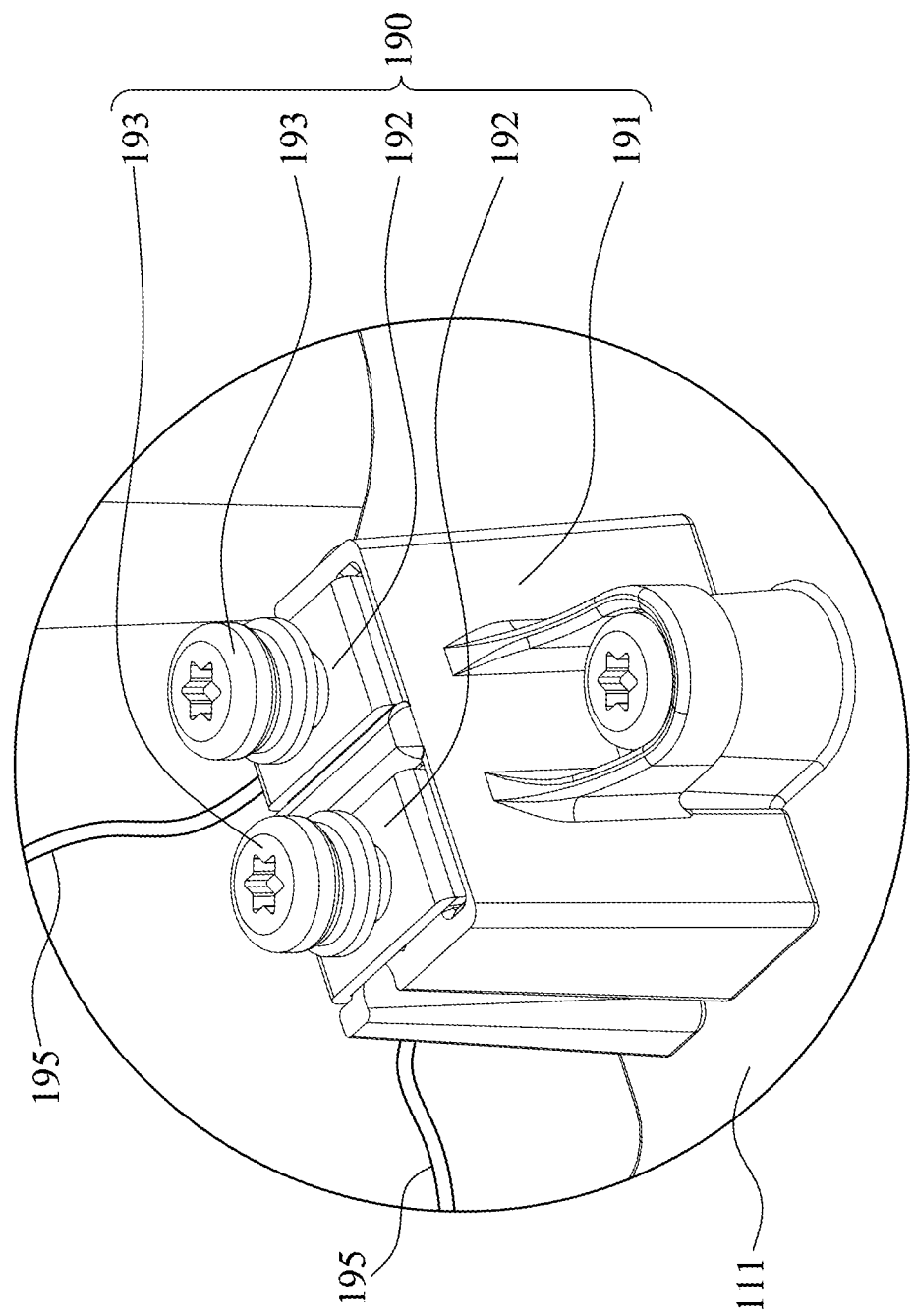
Figure 6:
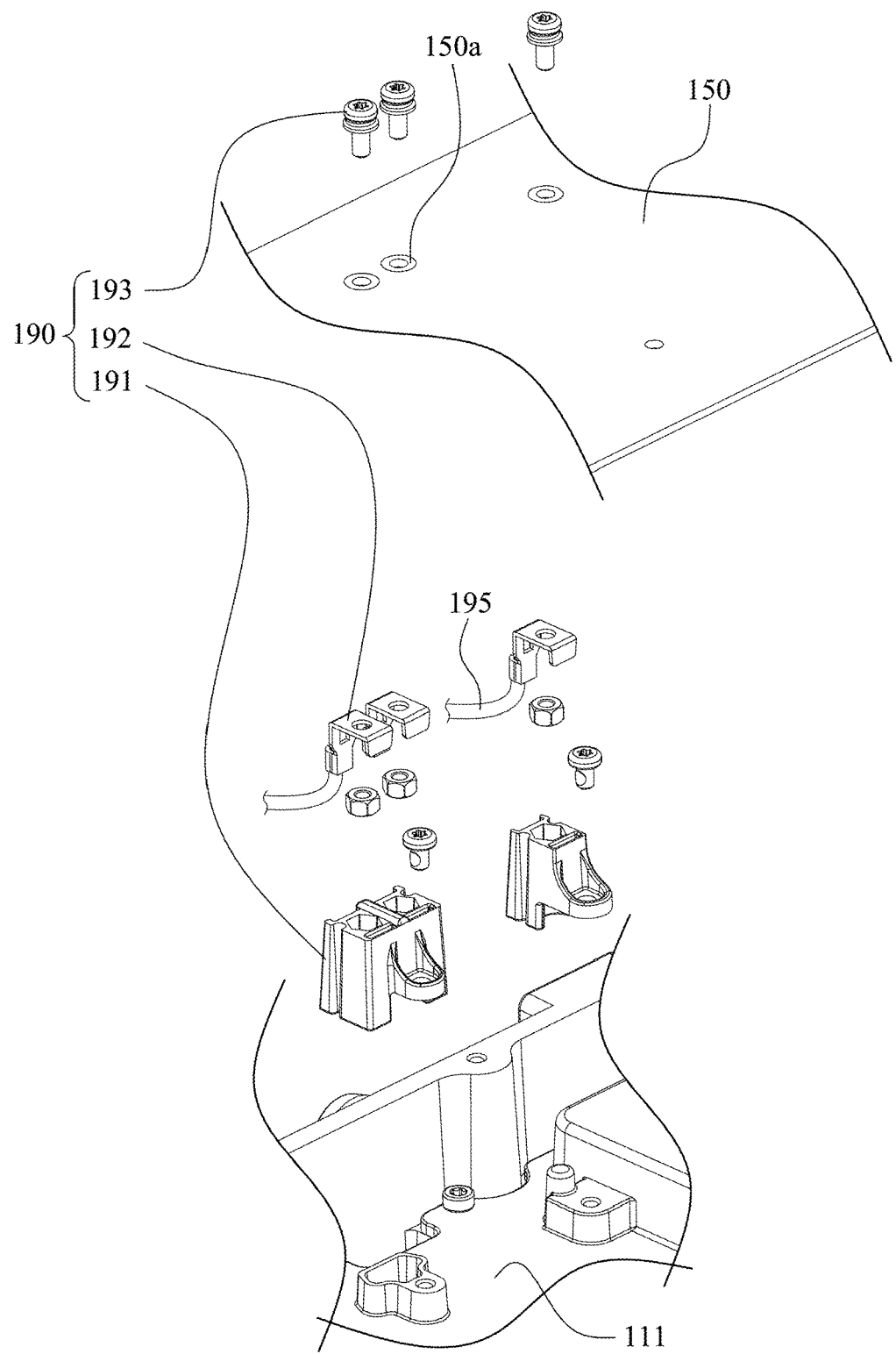

Reference is made to FIGS. 4-6. FIGS. 4-6 are partially enlarged views of the strut 190 of the power conversion device 100 of FIG. 1. In this embodiment, as shown in FIGS. 4-6, the power conversion device 100 further includes at least one strut 190 and at least one conducting wire 195. The strut 190 is fastened together with the converter module 150 and the base plate 111. The strut 190 includes an insulating column 191, a terminal 192 and a fastener 193. An end of the insulating column 191 is connected with and fixed on the base plate 111. Another end of the insulating column 191 supports the converter module 150. The terminal 192 is located between the insulating column 191 and the converter module 150. The converter module 150 has at least one connecting end 150a, and the connecting end 150a is electrically connected with the terminal 192. Provided that the terminal 192 and the converter module 150 are connected, the relative position is not restricted. The conducting wire 195 is electrically connected with the terminal 192. In this way, the electrical connection between the terminal 192 and the connecting piece (such as the connecting end 150a in this embodiment) is conveniently achieved though the strut 190. For instance, in the present disclosure, an electrical connection can be conveniently achieved between the converter module 150 and the auxiliary circuit board module 155, or between the converter module 150 and other devices in other embodiments. For example, the electrical connection as mentioned above can be extended to any devices to be electrically connected in various embodiments such as connections between a device terminal and another device terminal, between a device terminal and a circuit board, between a device terminal and a copper plate, etc. However, this does not intend to limit the present disclosure. The fastener 193 fastens the converter module 150, the terminal 192 and the insulating column 191. In this way, apart from the function of electrical connection, the strut 190 can function to support the converter module 150.

On the other hand, as shown in FIG. 5, one insulating column 191 can include two terminals 192. The two terminals 192 can be electrically connected with various connecting ends (not shown in FIG. 5) of the converter module 150 respectively, consequently the way of the electrical connection between the strut 190 and the converter module 150 can be more flexible. It is noted that the quantity of the terminals 192 as cited herein is only illustrative and is not to limit the claimed scope. A person having ordinary skill in the art of the present disclosure may appropriately determine the quantity of the terminals 192 of each of the insulating column 191 depending on actual situations.

In summary, when compared with the prior art, the embodiments of the present disclosure mentioned above have obvious advantages and beneficial effects. Through the technical solutions as mentioned above, a substantial improvement in the technology, and also the value of extensive use in the industry, are achieved. There is at least the following advantage: in one embodiment of the present disclosure as mentioned above, the converter module is located between the base plate and the structural plate. The auxiliary circuit board module is located at a side of the structural plate away from the base plate, and is electrically connected with the converter module. Therefore, the arrangement of the auxiliary circuit board module and the converter module can be closely disposed, so as to effectively reduce the overall dimensions of the power conversion device.

Figure 7:
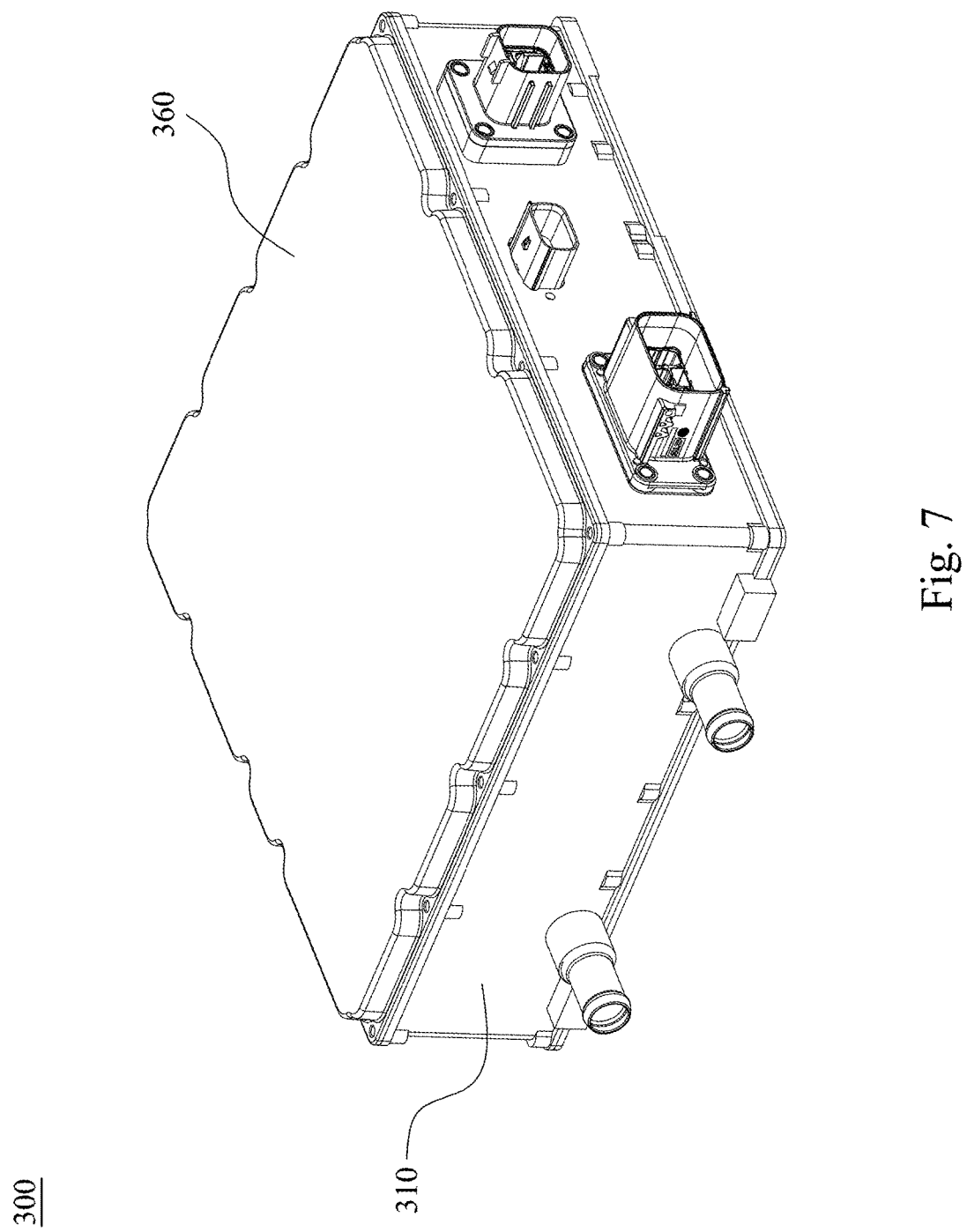
FIG. 7 is a schematic perspective view of a power conversion device according to another embodiment of the present disclosure.
Figure 8:
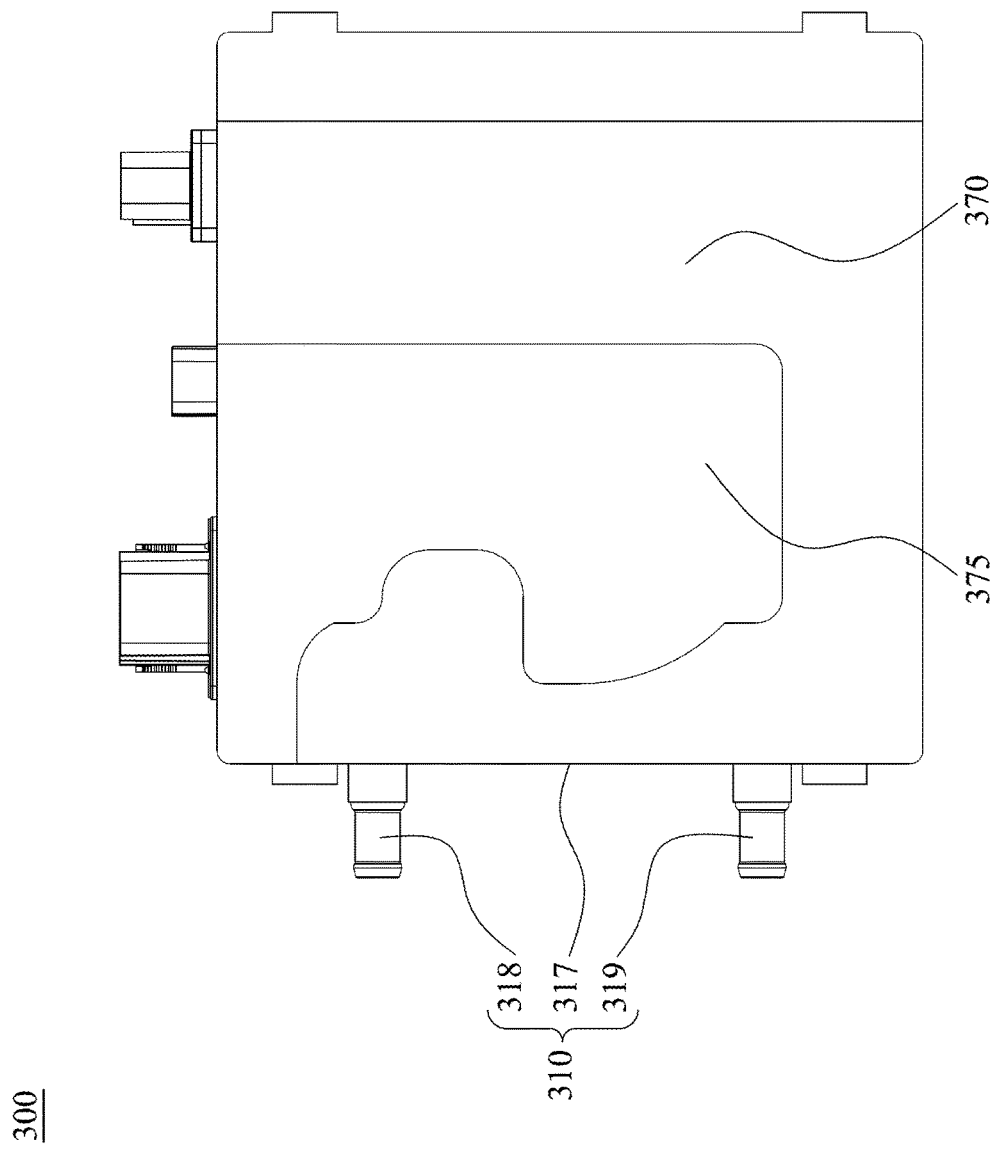
FIG. 8 is a bottom view of the power conversion device of FIG. 7.
Figure 9:
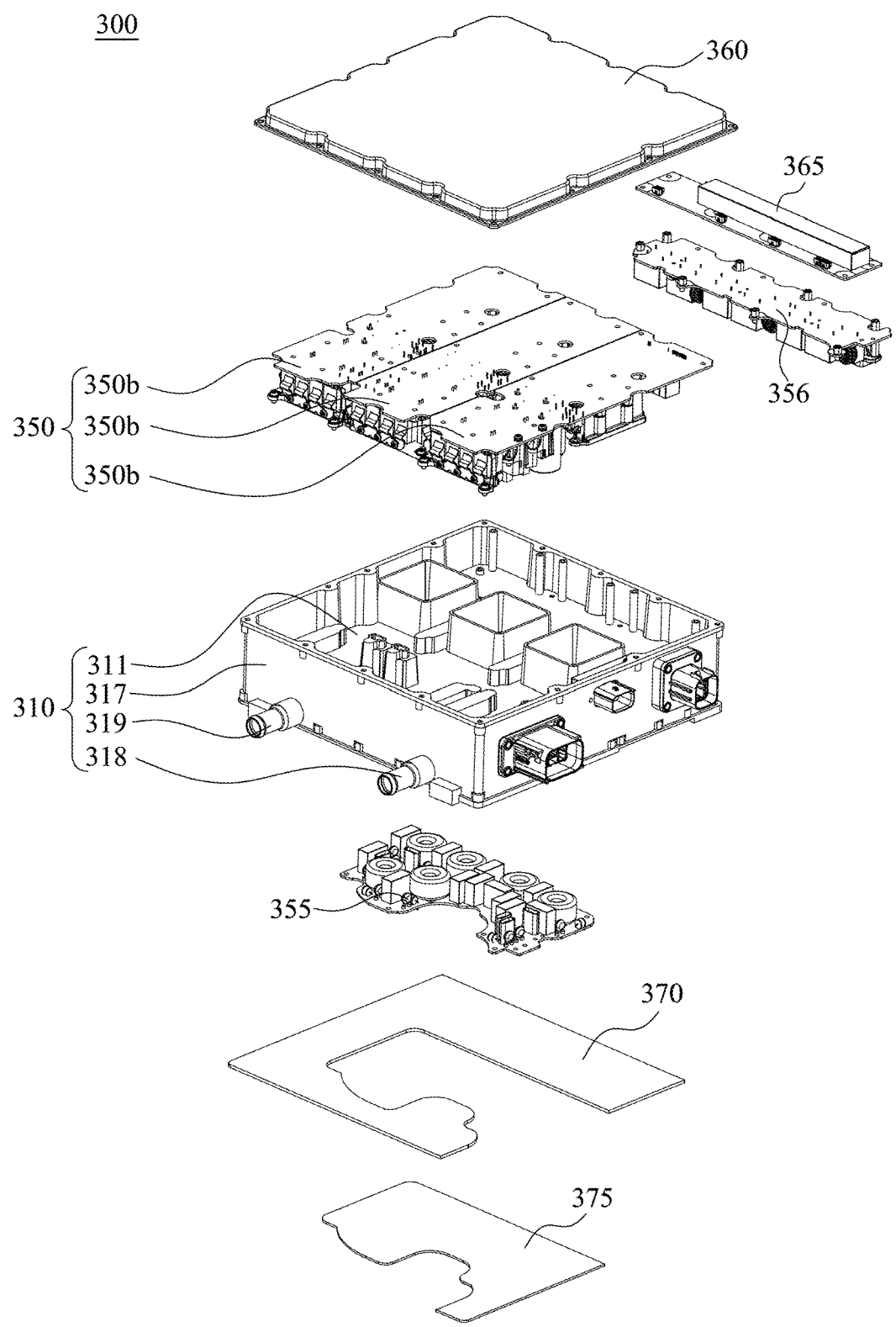
FIG. 9 is an exploded view of the power conversion device of FIG. 7.
Figure 10:
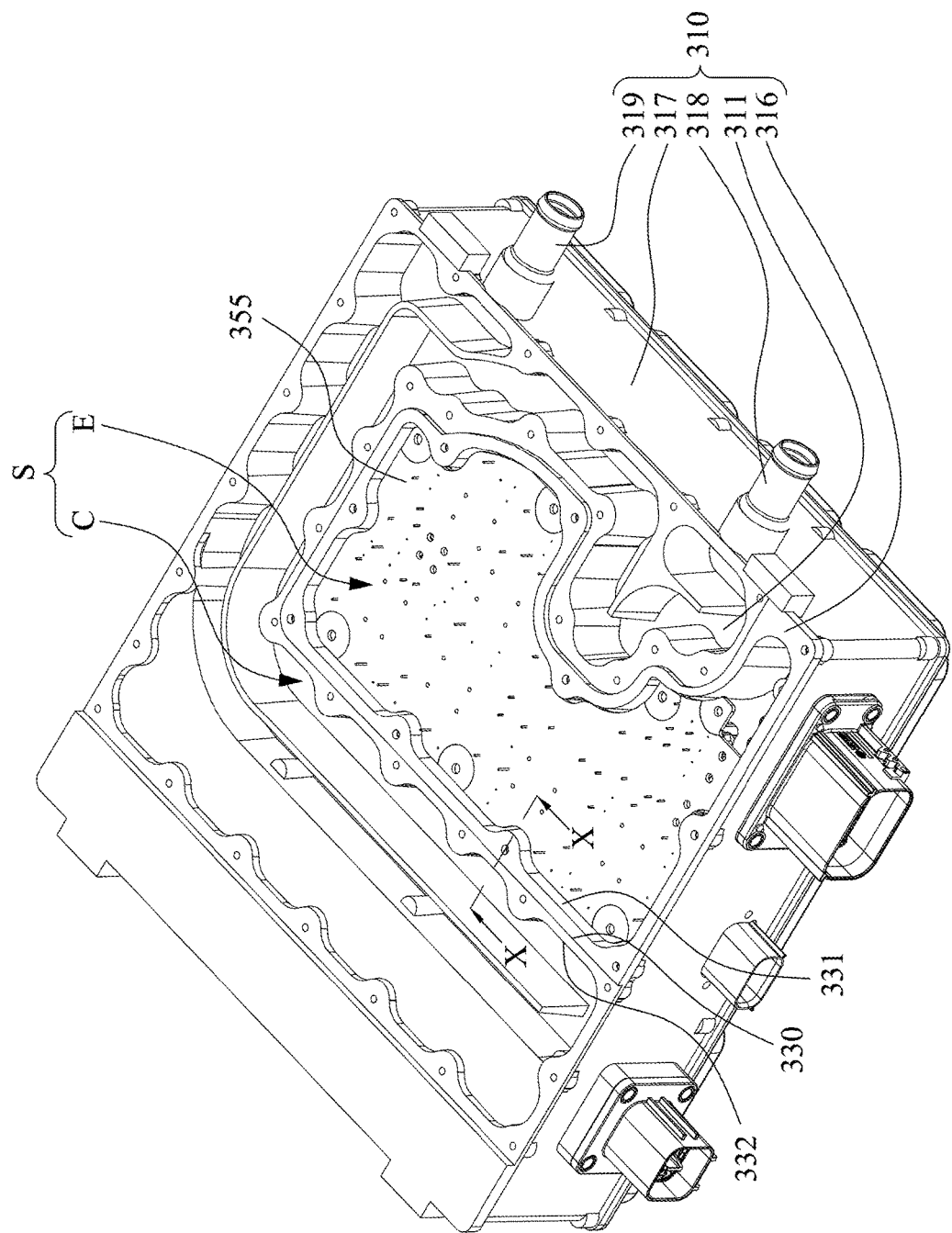
FIG. 10 is a perspective view of the power conversion device of FIG. 7 as viewed from the back with the circuit board base plate and the coolant channel base plate removed.
Figure 11:
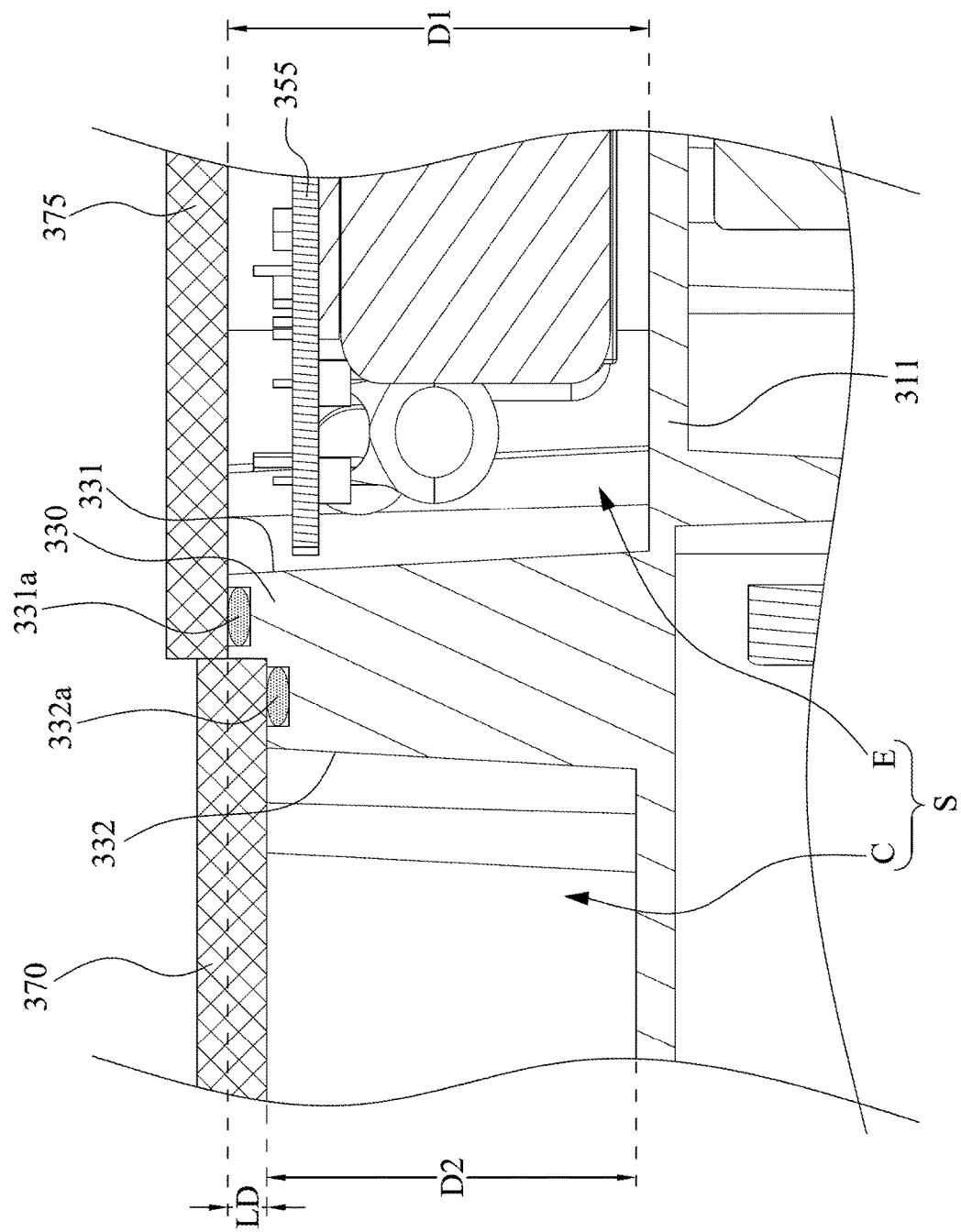
FIG. 11 is a partially cross-sectional view along the section line X of the power conversion device of FIG. 10 after the circuit board base plate and the coolant channel base plate are installed.

Reference is made to FIGS. 7-11. FIG. 7 is a schematic perspective view of a power conversion device 300 according to another embodiment of the present disclosure. FIG. 8 is a bottom view of the power conversion device 300 of FIG. 7. FIG. 9 is an exploded view of the power conversion device 300 of FIG. 7. FIG. 10 is a perspective view of the power conversion device 300 of FIG. 7 as viewed from the back with the circuit board base plate 375 and the coolant channel base plate 370 removed. FIG. 11 is a partially cross-sectional view along the section line X of the power conversion device 300 of FIG. 10 after the circuit board base plate 375 and the coolant channel base plate 370 are installed. As shown in FIGS. 7-11, the power conversion device 300 includes a casing 310, an isolation wall 330, a first circuit board unit 355, a converter module 350, a coolant channel base plate 370, a circuit board base plate 375 and a top cover 360. The casing 310 includes a base plate 311. The base plate 311 has a base surface 316 and a recessed space S on the base surface 316. The isolation wall 330 partitions the recessed space S into a circuit board accommodation space E and a coolant channel C. The isolation wall 330 has a circuit board subsidiary wall 331 adjacent to the circuit board accommodation space E and a coolant channel subsidiary wall 332 adjacent to the coolant channel C. The circuit board subsidiary wall 331 and the coolant channel subsidiary wall 332 have a height difference LD. The first circuit board unit 355 is located in the circuit board accommodation space E. The converter module 350 is located on a side of the base plate 311 opposite to the recessed space S. In practical applications, the first circuit board unit 355 is an electromagnetic interference control board. The electromagnetic interference control board can be independently sealed in the circuit board accommodation space E, so as to reduce the electromagnetic interference with other boards, and achieve a better effect of electromagnetic compatibility. In this embodiment, the first circuit board unit 355 is the electromagnetic interference control board. However, this does not intend to limit the present disclosure. The coolant channel base plate 370 fluidly seals the coolant channel C. The circuit board base plate 375 seals the first circuit board unit 355. The top cover 360 seals the converter module 350.

In practical applications, as shown in FIG. 11, a sealing ring 332a can be disposed between the coolant channel base plate 370 and the coolant channel subsidiary wall 332, consequently the coolant channel base plate 370 can fluidly seal the coolant channel C.

To be further illustrated, the circuit board base plate 375 seals the circuit board accommodation space E, in which the circuit board base plate 375 and the coolant channel base plate 370 respectively at least partially abut the circuit board subsidiary wall 331 and the coolant channel subsidiary wall 332 directly or indirectly, consequently the circuit board base plate 375 and the coolant channel base plate 370 have the height difference LD in between.

Similarly, in practical applications, a sealing ring 331a can also be disposed between the circuit board base plate 375 and the circuit board subsidiary wall 331, consequently the circuit board base plate 375 can fluidly seal the circuit board accommodation space E.

In other words, with this simple structure easily made, the power conversion device 300 has at least three characteristics to prevent the coolant in the coolant channel C from leaking from the coolant channel C and even flowing into the circuit board accommodation space E, which increases the reliability of the whole power conversion device 300. The three characteristics are as follows: firstly, since the coolant channel base plate 370 fluidly seals the coolant channel C, the coolant cannot leak from the coolant channel C. Secondly, even if the coolant leaks from the coolant channel C due to the appearance of a gap or other unknown reasons, since the height of the circuit board subsidiary wall 331 is different from the height of the coolant channel subsidiary wall 332, the coolant leaked will not flow directly towards the circuit board accommodation space E. Thus, the coolant leaked will not flow into the circuit board accommodation space E. Thirdly, since the circuit board base plate 375 seals the circuit board accommodation space E, the coolant leaked cannot flow into the circuit board accommodation space E. As a result, the first circuit board unit 355 located in the circuit board accommodation space E will not be reached by the coolant, and thus will not be damaged.

Furthermore, as shown in FIG. 11, the circuit board subsidiary wall 331 and the coolant channel subsidiary wall 332 have a height difference LD. In other words, a maximum vertical distance D1 of the circuit board subsidiary wall 331 to the base plate 311 is different from a maximum vertical distance D2 of the coolant channel subsidiary wall 332 to the base plate 311. In this embodiment, to be more specific, the maximum vertical distance D1 is larger than the maximum vertical distance D2.

To be more specific, the circuit board subsidiary wall 331 has a top surface opposite to the base plate 311. The coolant channel subsidiary wall 332 also has a top surface opposite to the base plate 311. A vertical distance of the top surface of the circuit board subsidiary wall 331 to the base plate 311 is the maximum vertical distance D1 as mentioned above. This maximum vertical distance D1 is different from a vertical distance of the top surface of the coolant channel subsidiary wall 332 to the base plate 311, i.e., the maximum vertical distance D2 as mentioned above. As mentioned above, in this embodiment, the maximum vertical distance D1 is larger than the maximum vertical distance D2.

Please refer again to the FIGS. 9-10. As shown in FIGS. 9-10, the casing 310 includes a side wall 317. The side wall 317 surrounds the base plate 311. The side wall 317 has a coolant inlet 318 and a coolant outlet 319 therein. The coolant inlet 318 and the coolant outlet 319 respectively communicate with the coolant channel C. Moreover, the converter module 350 includes a plurality of converters 350*b*. To be more specific, the quantity of the converters 350*b* is three. In one embodiment, the quantity of the converters 350*b* can be adjusted according to the actual design requirements. To be more specific, the coolant channel C passes each of the converters 350*b* of the converter module 350, so as to increase its efficiency of heat dissipation. To be more specific, the electronic elements on the converter module 350 are close to the base plate 311. When the converter module 350 located on the base plate 311 operates, the heat generated will be transmitted to the coolant channel C through the base plate 311. At this point, the coolant entering into the coolant channel C through the coolant inlet 318 will flow through the coolant channel C, and flow out of the coolant outlet 319 effectively bringing along the heat generated during the operation of the converter module 350.

On the other hand, in this embodiment, the power conversion device 300 can include a second circuit board unit 365. The second circuit board unit 365 is electrically connected with the converter module 350, and is located between the converter module 350 and the base plate 311, so as to increase the power density of the power conversion device 300. To be more specific, the electronic elements on the second circuit board unit 365 are close to the base plate 311. However, this does not intend to limit the present disclosure. For example, the electronic elements on the second circuit board unit 365 can be close to the converter module 350. In one embodiment, the second circuit board unit 365 is a low voltage circuit board.

In addition, the power conversion device 300 further includes a third circuit board unit 356. The third circuit board unit 356 is electrically connected with the converter module 350. Similarly, in this embodiment, the third circuit board unit 356 is also located between the converter module 350 and the base plate 311, so as to increase the power density of the power conversion device 300. In one embodiment, the second circuit board unit 365 is located between the converter module 350 and the base plate 311, and the third circuit board unit 356 is located between the second circuit board unit 365 and the base plate 311, so as to increase the power density of the power conversion device 300. To be more specific, the electronic elements on the third circuit board unit 356 are close to the base plate 311. When the third circuit board unit 356 operates, the heat generated will be transmitted to the coolant channel C through the base plate 311. However, this does not intend to limit the present disclosure. For example, the electronic elements on the third circuit board unit 356 can be close to the second circuit board unit 365. In one embodiment, the third circuit board unit 356 is an output board. The output board is configured to sum up the loading capacity of at least one of the converters 350*b* into a loading capacity of the power conversion device 300.

In one embodiment, one of the electromagnetic interference control board, the low voltage circuit board and the output board is located in the circuit board accommodation space E, or any two of those are located in the circuit board accommodation space E, or all three of those are located in the circuit board accommodation space E.

Figure 12:
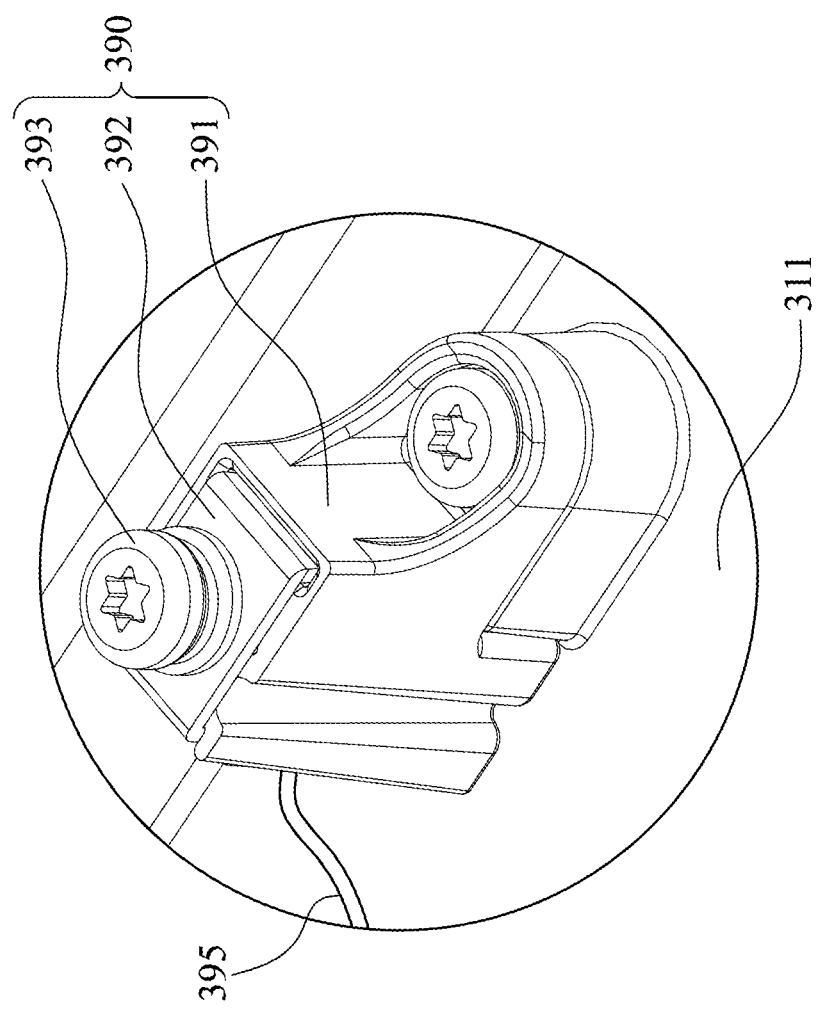
FIGS. 12-13 are partially perspective enlarged views of the strut of FIG. 9 connected with the converter module and the base plate.
Figure 13:
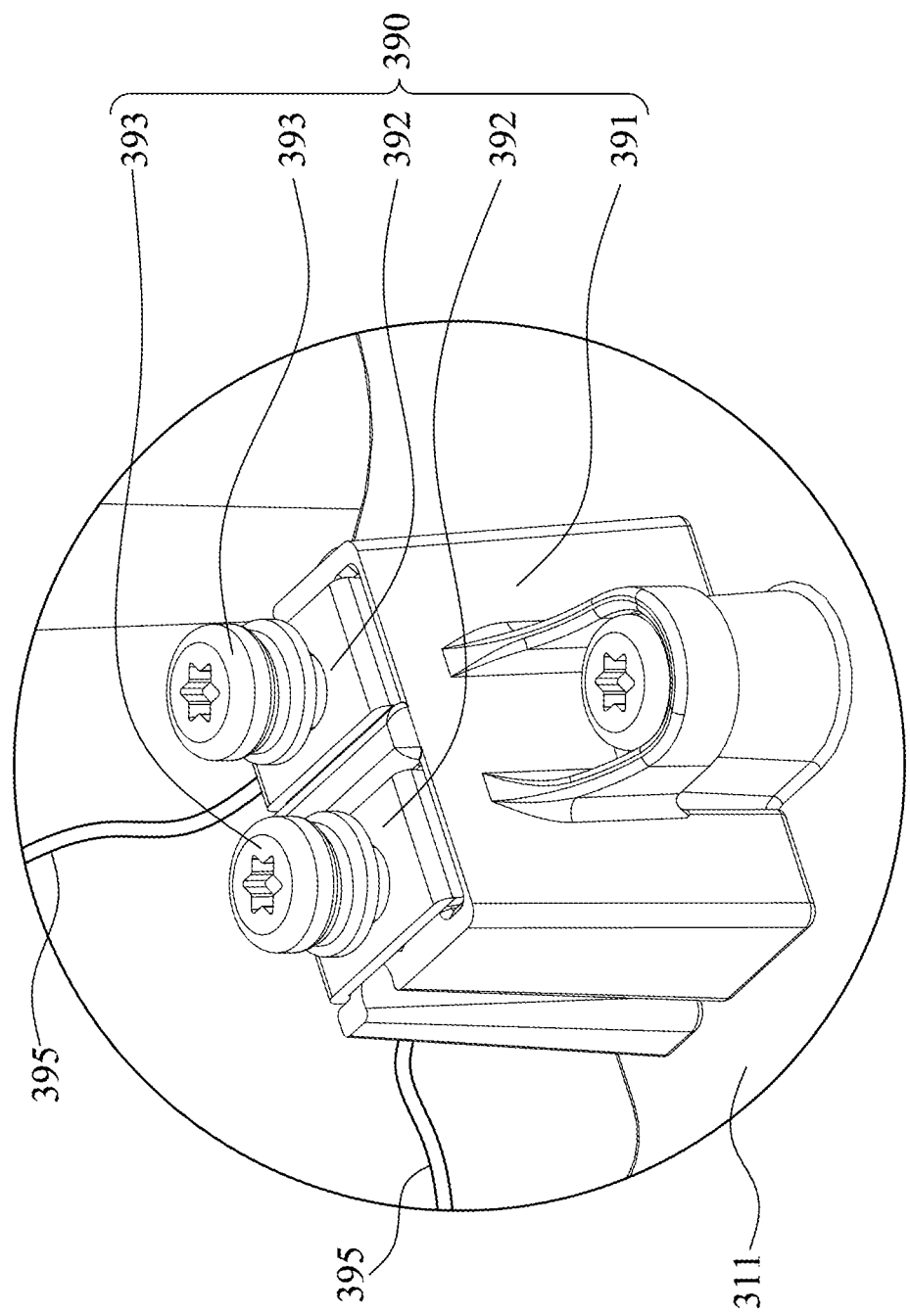

Reference is made to FIGS. 12-13. FIGS. 12-13 are partially perspective enlarged views of the strut 390 of FIG. 9 connected with the converter module 350 and the base plate 311. In this embodiment, as shown in FIG. 12, the power conversion device 300 further includes at least one strut 390 and a conducting wire 395. The strut 390 is fastened together with the converter module 350 (not shown in FIG. 12, please refer to FIG. 9) and the base plate 311. The strut 390 includes an insulating column 391, a terminal 392 and a fastener 393. An end of the insulating column 391 is connected with and fixed on the base plate 311. Another end of the insulating column 391 supports the converter module 350. The terminal 392 is located between the insulating column 391 and the converter module 350. The converter module 350 has at least one connecting end (not shown), and the connecting end is electrically connected with the terminal 392. Provided that the terminal 392 and the converter module 350 are connected, the relative position is not restricted. The conducting wire 395 is electrically connected with the terminal 392. In this way, the electrical connection between the terminal 392 and the connecting piece (such as the connecting end in this embodiment) is conveniently achieved though the strut 390. For instance, in the present disclosure, an electrical connection can be conveniently achieved between the converter module 350 and the first circuit board unit 355, or between the converter module 350 and other devices in other embodiments. For example, the electrical connection as mentioned above can be extended to any devices to be electrically connected in various embodiments such as connections between a device terminal and another device terminal, between a device terminal and a circuit board, between a device terminal and a copper plate, etc. However, this does not intend to limit the present disclosure. The fastener 393 fastens the converter module 350, the terminal 392 and the insulating column 391. In this way, apart from the function of electrical connection, the strut 390 can function to support the converter module 350.

On the other hand, as shown in FIG. 13, one insulating column 391 can include two terminals 392. The two terminals 392 can be electrically connected with various connecting ends (not shown) of the converter module 350 respectively, consequently the way of the electrical connection between the strut 390 and the converter module 350 can be more flexible. It is noted that the quantity of the terminals 392 as cited herein is only illustrative and is not to limit the claimed scope. A person having ordinary skill in the art of the present disclosure may appropriately determine the quantity of the terminals 392 of each of the insulating column 391 depending on actual situations.

In summary, when compared with the prior art, the embodiments of the present disclosure mentioned above have obvious advantages and beneficial effects. Through the technical solutions as mentioned above, a substantial improvement in the technology, and also the value of extensive use in the industry, are achieved. There are at least the following advantages:

(1) With the simple structure easily made, the power conversion device has at least three characteristic to prevent the coolant in the coolant channel from leaking from the coolant channel and even flowing into the circuit board accommodation space, which increases the reliability of the whole power conversion device.

(2) Since the coolant channel base plate fluidly seals the coolant channel, the coolant cannot leak from the coolant channel. Even if the coolant leaks from the coolant channel due to the appearance of a gap or other unknown reasons, since the height of the circuit board subsidiary wall is different from the height of the coolant channel subsidiary wall, the coolant leaked will not flow directly towards the circuit board accommodation space. Thus, the coolant leaked will not flow into the circuit board accommodation space. In addition, since the circuit board base plate seals the circuit board accommodation space, the coolant leaked cannot flow into the circuit board accommodation space.

Figure 14:
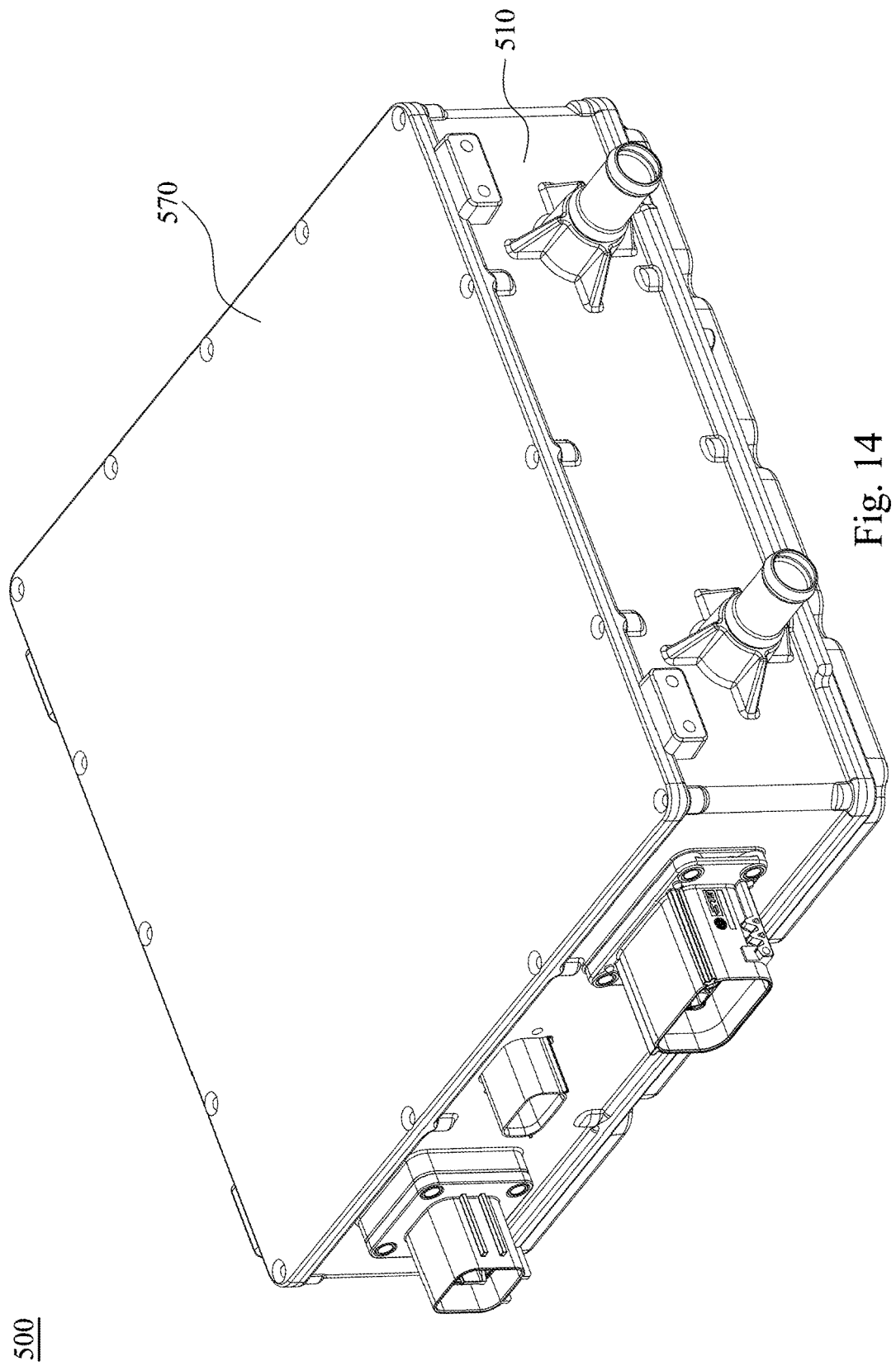
FIG. 14 is a schematic perspective view of a power conversion device according to a further embodiment of the present disclosure.
Figure 15:
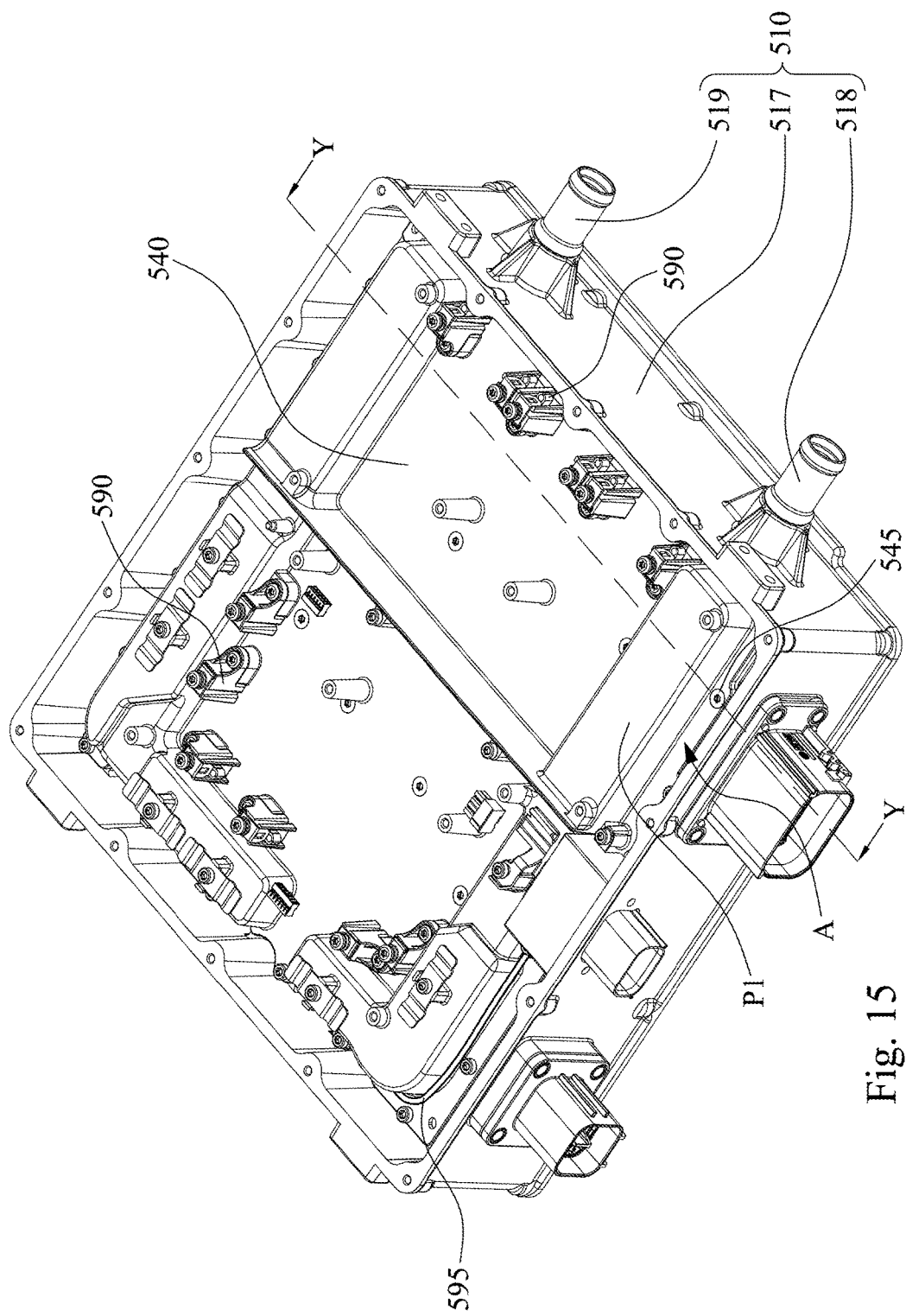
FIG. 15 is a perspective view of the power conversion device of FIG. 14 as viewed from the back with the top cover and the auxiliary circuit board module removed.
Figure 16:
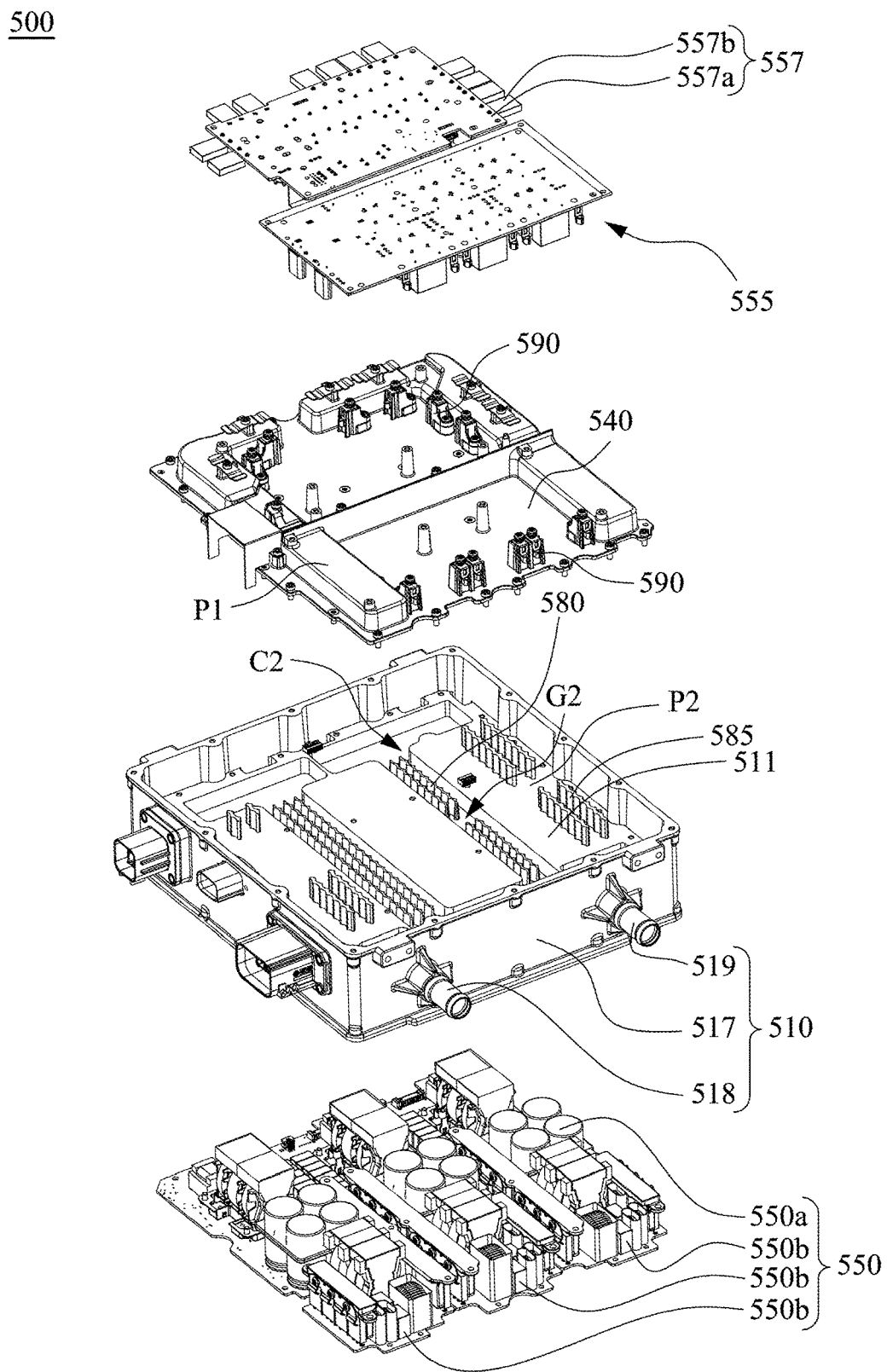
FIG. 16 is an exploded view from the bottom of the power conversion device of FIG. 14.
Figure 17:
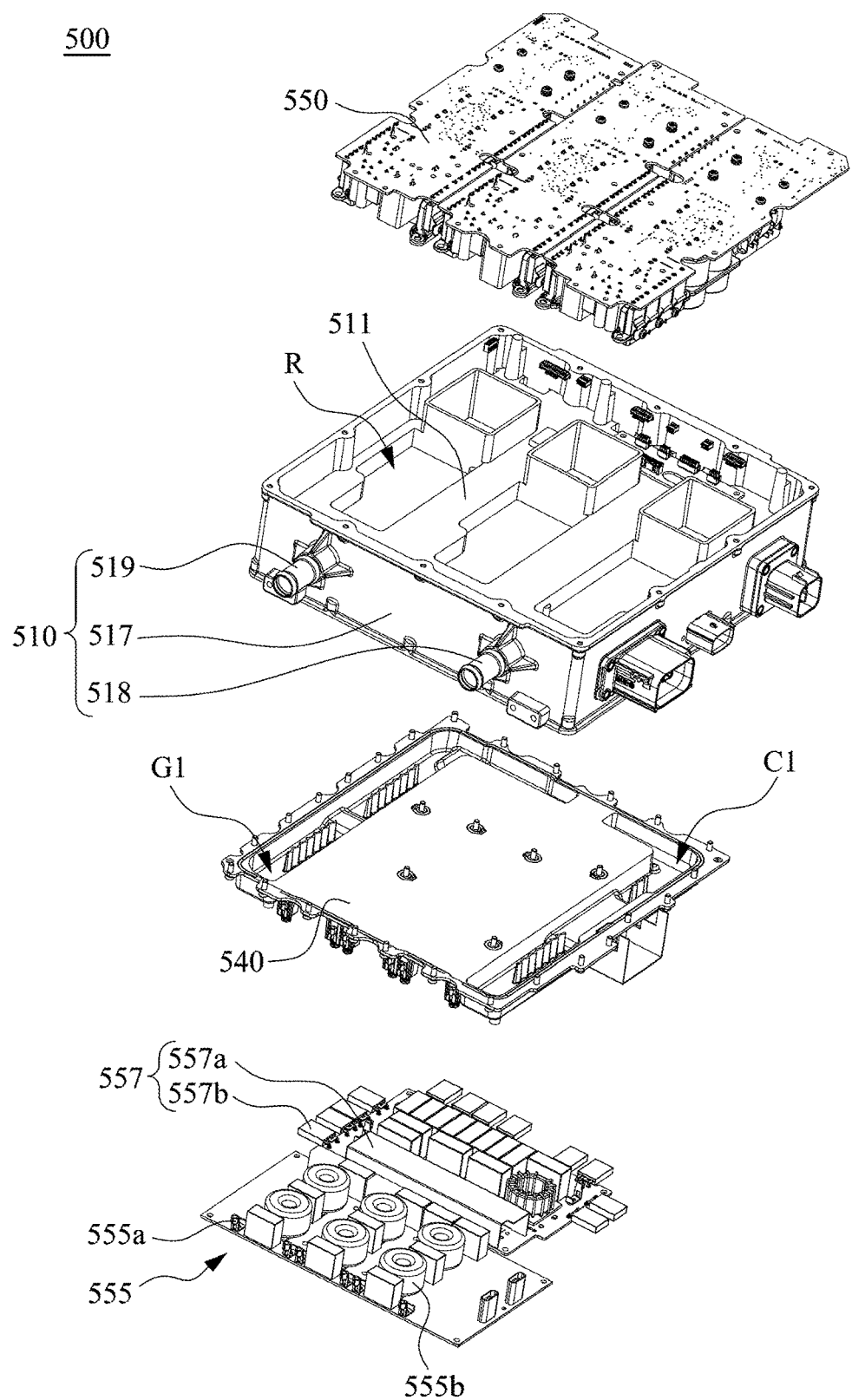
FIG. 17 is an exploded view from the top of the power conversion device of FIG. 14.
Figure 18:
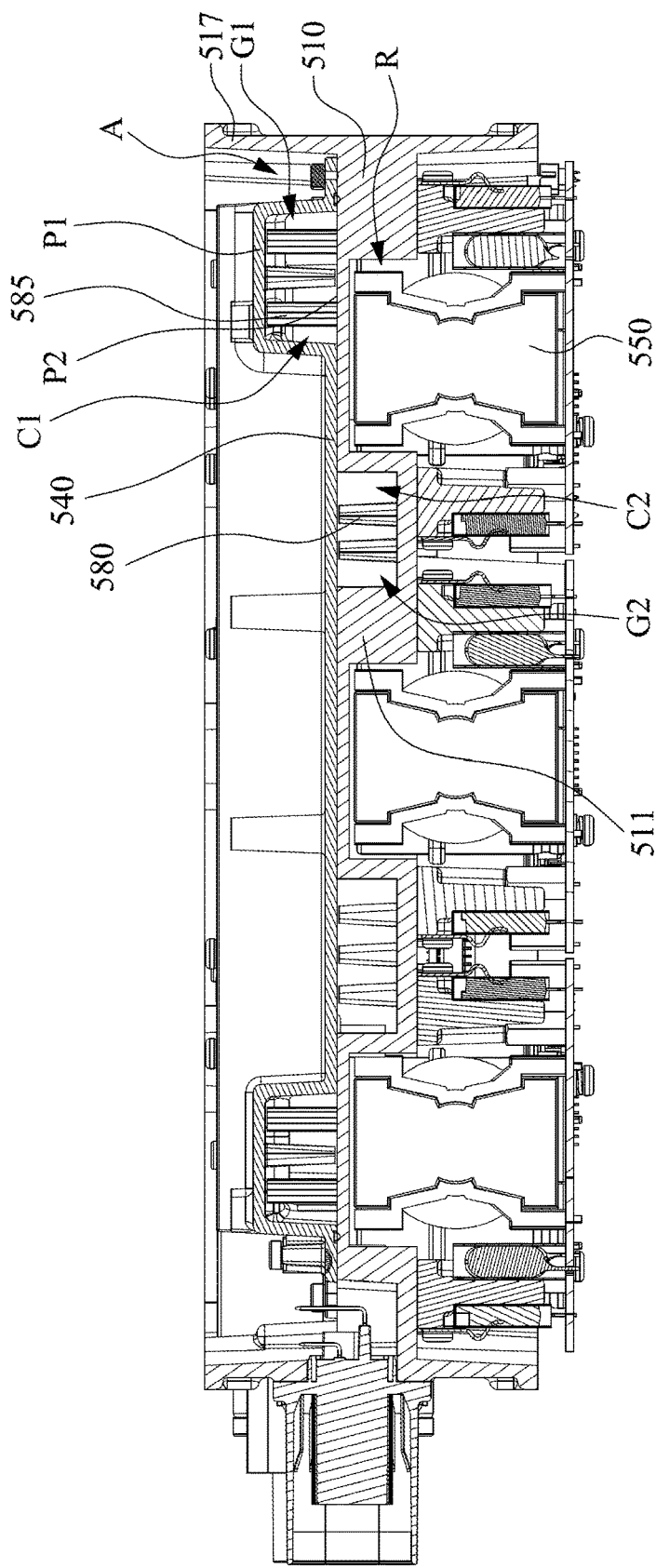
FIG. 18 is a partially cross-sectional view along the section line Y of the power conversion device of FIG. 15.

Reference is made to FIGS. 14-18. FIG. 14 is a schematic perspective view of a power conversion device 500 according to a further embodiment of the present disclosure. FIG. 15 is a perspective view of the power conversion device 500 of FIG. 14 as viewed from the back with the top cover 570 and the auxiliary circuit board module 555 removed. FIG. 16 is an exploded view from the bottom of the power conversion device 500 of FIG. 14. FIG. 17 is an exploded view from the top of the power conversion device 500 of FIG. 14. FIG. 18 is a partially cross-sectional view along the section line Y of the power conversion device 500 of FIG. 15. As shown in FIGS. 14-18, the power conversion device 500 includes a casing 510, a middle plate 540 and a converter module 550. The converter module 550 includes a plurality of converters 550b. To be more specific, in this embodiment, the quantity of the converters 550b can be three. In one embodiment, the quantity of the converters 550b can be adjusted according to the actual design requirements. The casing 510 includes a base plate 511. The base plate 511 has a concave recess R therein. The base plate 511 forms a base plate convex hull P2 at a side opposite to the concave recess R. The middle plate 540 has a middle plate groove G1 therein. The middle plate groove G1 corresponds to the base plate convex hull P2. The middle plate 540 and the base plate 511 combine up, consequently the base plate convex hull P2 fluidly seals the middle plate groove G1, making the middle plate groove G1 to form a first coolant channel C1. The converter module 550 is at least partially located in the concave recess R.

In other words, the coolant in the first coolant channel C1 can be directly in contact with the base plate convex hull P2. In this way, when the converter module 550 located in the concave recess R operates, the heat generated can be effectively delivered away by the coolant though the base plate convex hull P2, consequently the power conversion device 500 has a good rate of heat dissipation.

As shown in FIGS. 16-17, the base plate 511 further has a base plate groove G2. The base plate groove G2 corresponds to the middle plate 540. The middle plate 540 fluidly seals the base plate groove G2, consequently the base plate groove G2 forms a second coolant channel C2. In this embodiment, the middle plate 540 forms a middle plate convex hull P1 at a side opposite to the middle plate groove G1. The power conversion device 500 further includes an auxiliary circuit board module 555. The auxiliary circuit board module 555 includes an output board 557. The output board 557 includes a printed circuit board 557a and a diode 557b. The diode 557b lies flat relative to the printed circuit board 557a, and a heating portion of the diode 557b at least partially attaches to the middle plate convex hull P1, consequently the coolant in the first coolant channel C1 can deliver away the heat generated during the operation of the diode 557b through a top wall of the middle plate convex hull P1, which further increases the ability of heat dissipation of the power conversion device 500. In addition, the auxiliary circuit board module 555 is located at a side of the middle plate 540 disposed with the middle plate convex hull P1. The auxiliary circuit board module 555 includes a heat dissipation piece 555b, and the heat dissipation piece 555b is close to the middle plate 540, facilitating the heat dissipation of the heat dissipation piece 555b. Similarly, the converter module 550 is located at a side of the base plate 511 disposed with the concave recess R. The converter module 550 includes a heat dissipation piece 550a, and the heat dissipation piece 550a is close to the base plate 511, facilitating the heat dissipation of the heat dissipation piece 550a. Moreover, the base plate groove G2 is adjacent to the base plate convex hull P2, consequently the coolant in the second coolant channel C2 can also deliver away the heat generated during the operation of the converter module 550 through a side wall of the base plate convex hull P2, which further increases the ability of heat dissipation of the power conversion device 500.

The casing 510 includes a side wall 517. The side wall 517 surrounds the base plate 511, and the side wall 517 has a coolant inlet 518 and a coolant outlet 519 therein. As shown in FIG. 15, the coolant inlet 518 and the coolant outlet 519 respectively communicate with the first coolant channel C1. In addition, the first coolant channel C1 and the second coolant channel C2 are mutually communicated. Therefore, a user can input the coolant through the coolant inlet 518. The coolant will first pass through the first coolant channel C1 communicated with the coolant inlet 518, and then enter into the second coolant channel C2. Afterwards, the coolant will flow to the first coolant channel C1 communicated with the coolant outlet 519, and flow out of the coolant outlet 519 bringing along the heat generated during the operation of the converter module 550. However, this does not intend to limit the present disclosure. In one embodiment, the coolant inlet 518 can communicate with the first coolant channel C1 or the second coolant channel C2 according to the actual design requirements. Meanwhile, the coolant outlet 519 can also communicate with the first coolant channel C1 or the second coolant channel C2 according to the actual design requirements.

In order to reduce the thermal resistance and increase the rate of heat transfer, the power conversion device 500 further includes at least one fin 580. As shown in FIG. 16, the fin 580 stands in the base plate groove G2, and is located in the second coolant channel C2. When the coolant passes the fin 580, the fin 580 provides a larger surface of heat dissipation, consequently the thermal resistance is reduced while the rate of heat transfer is increased.

Similarly, the power conversion device 500 further includes at least one fin 585. As shown in FIG. 16, the fin 585 stands in the base plate convex hull P2, and is located in the first coolant channel C1. In this embodiment, both the fin 580 and the fin 585 are in wavy shapes. However, this does not intend to limit the present disclosure.

As shown in FIGS. 15-16, the middle plate 540 forms a middle plate convex hull P1 at a side opposite to the middle plate groove G1 (not shown in FIGS. 15-16, please refer to FIG. 17). The middle plate convex hull P1 and the side wall 517 form an accommodation space A in between. The power conversion device 500 includes at least one fixing piece 545. The fixing piece 545 fastens together the middle plate 540 and the base plate 511, and is at least partially located in the accommodation space A. In this way, the fixing piece 545 will not occupy any space outside the accommodation space A, which is beneficial to save the space inside the power conversion device 500, and also helps to reduce the overall dimensions of the power conversion device 500.

On the other hand, the power conversion device 500 includes at least one conducting wire 595. The conducting wire 595 is electrically connected with the converter module 550, and is at least partially located in the accommodation space A. Similarly, the conducting wire 595 will not occupy any space outside the accommodation space A, which is beneficial to save the space inside the power conversion device 500, and also helps to reduce the overall dimensions of the power conversion device 500.

Figure 19:
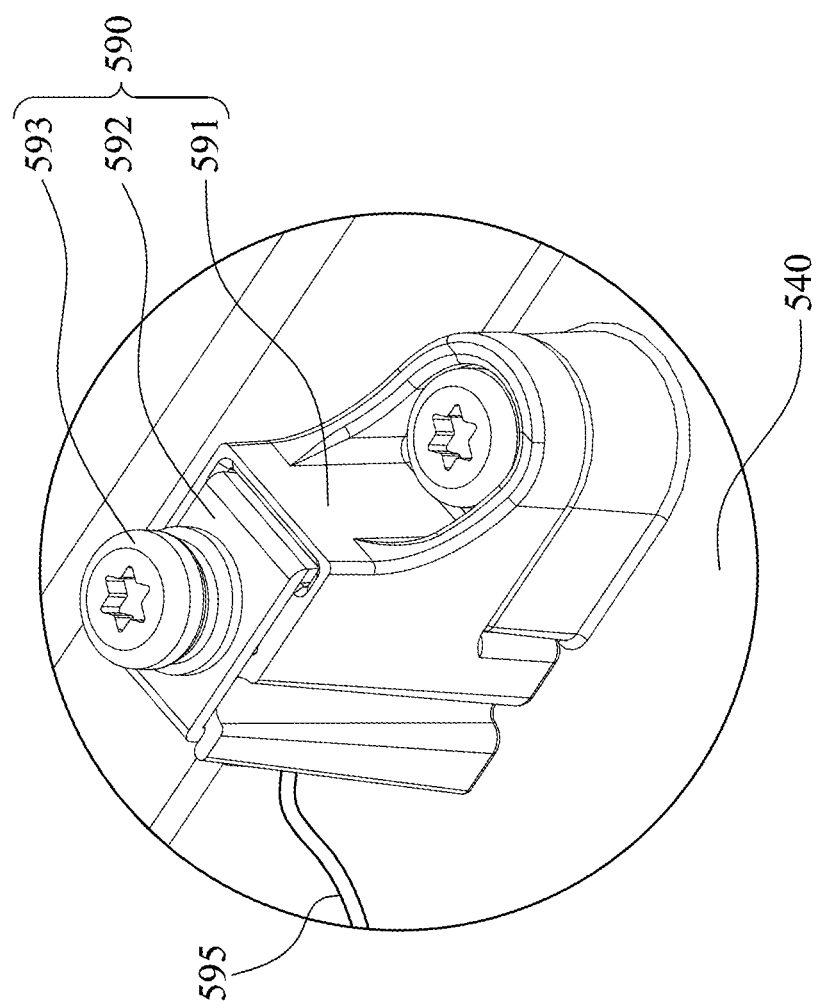
FIGS. 19-20 are partially enlarged views of the strut of the power conversion device of FIG. 15.
Figure 20:
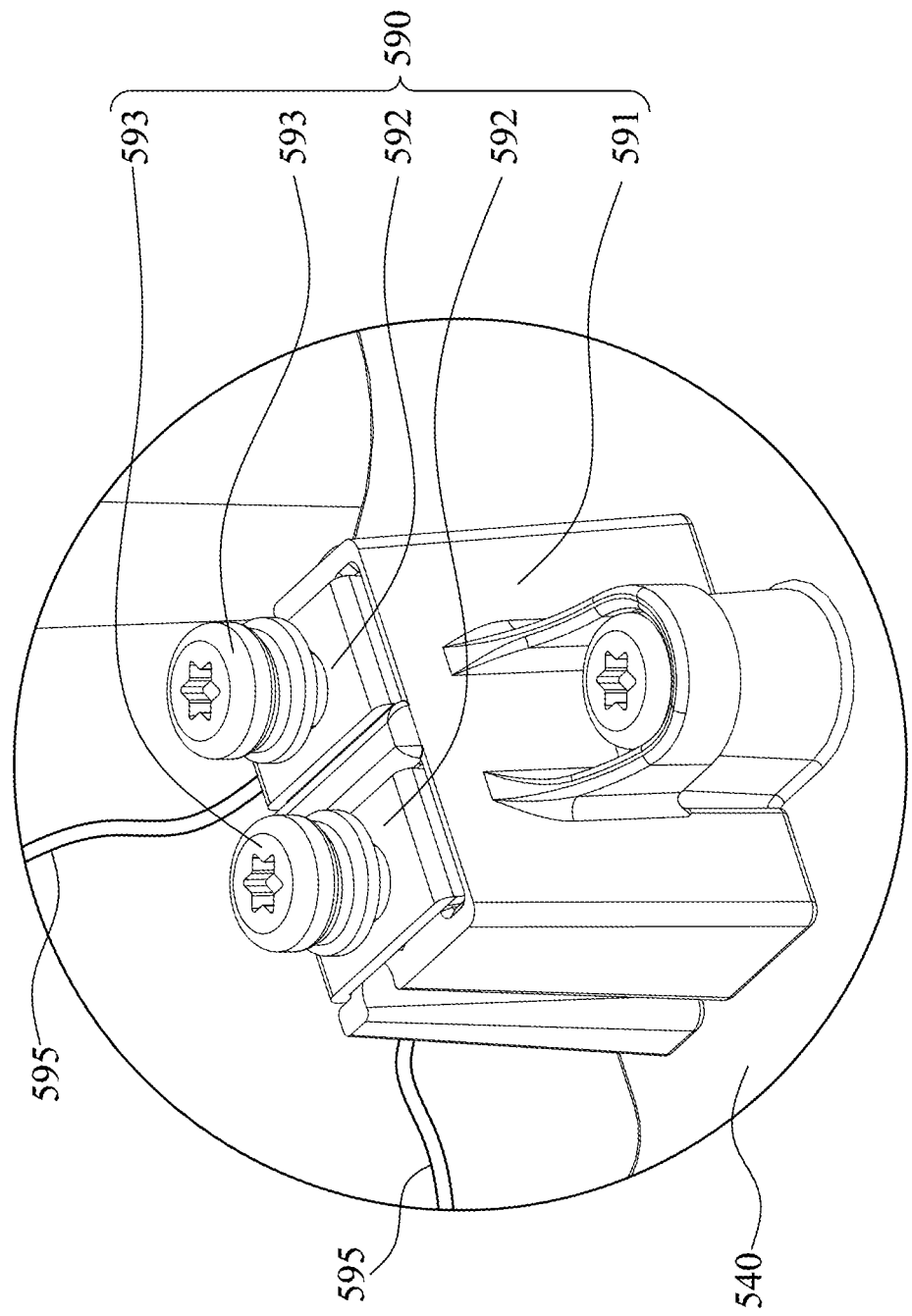

Reference is made to FIGS. 19-20. FIGS. 19-20 are partially enlarged views of the strut 590 of the power conversion device 500 of FIG. 15. In this embodiment, the auxiliary circuit board module 555 (not shown in FIGS. 19-20, please refer to FIGS. 16-17) is located at a side of the middle plate 540 away from the base plate 511. As shown in FIG. 19, the power conversion device 500 further includes at least one strut 590 and a conducting wire 595. The strut 590 is fastened together with the auxiliary circuit board module 555 and the middle plate 540. The strut 590 includes an insulating column 591, a terminal 592 and a fastener 593. An end of the insulating column 591 is connected with and fixed on the middle plate 540. Another end of the insulating column 591 supports the auxiliary circuit board module 555. The terminal 592 is located between the insulating column 591 and the auxiliary circuit board module 555. The auxiliary circuit board module 555 has at least one connecting end 555a (not shown in FIG. 19, please refer to FIG. 17), and the connecting end 555a is electrically connected with the terminal 592. Provided that the terminal 592 and the auxiliary circuit board module 555 are connected, the relative position is not restricted. The conducting wire 595 is electrically connected with the terminal 592. In this way, the electrical connection between the terminal 592 and the connecting piece is conveniently achieved though the strut 590. For instance, in the present disclosure, an electrical connection can be conveniently achieved between the converter module 550 and the auxiliary circuit board module 555, or between the converter module 550 and other devices in other embodiments, or between the auxiliary circuit board module 555 and other devices in other embodiments. For example, the electrical connection as mentioned above can be extended to any devices to be electrically connected in various embodiments such as connections between a device terminal and another device terminal, between a device terminal and a circuit board, between a device terminal and a copper plate, etc. However, this does not intend to limit the present disclosure. The fastener 593 fastens the auxiliary circuit board module 555, the terminal 592 and the insulating column 591. In this way, apart from the function of electrical connection, the strut 590 can function to support the auxiliary circuit board module 555.

In this embodiment, the auxiliary circuit board module 555 can be an electromagnetic interference control board and/or an output board and/or a low voltage circuit board. However, this does not intend to limit the present disclosure. In this embodiment, an end of the insulating column 591 is connected with and fixed on the middle plate 540. However, this does not intend to limit the present disclosure. In other embodiments, an end of the insulating column 591 can also be connected with and fixed on other connecting bases, such as the base plate 511, the auxiliary circuit board module 555 or the converter module 550 in the present disclosure. In this embodiment, the one being supported is the auxiliary circuit board module 555. However, this does not intend to limit the present disclosure. In other embodiments, the one being supported can be the converter module 550.

On the other hand, as shown in FIG. 20, one insulating column 591 can include two terminals 592. The two terminals 592 can be electrically connected with various connecting ends 555a (not shown in FIG. 20, please refer to FIG. 17) respectively, consequently the way of the electrical connection between the strut 590 and the auxiliary circuit board module 555 can be more flexible. It is noted that the quantity of the terminals 592 as cited herein is only illustrative and is not to limit the claimed scope. A person having ordinary skill in the art of the present disclosure may appropriately determine the quantity of the terminals 592 of each of the insulating column 591 depending on actual situations.

In summary, when compared with the prior art, the embodiments of the present disclosure mentioned above have obvious advantages and beneficial effects. Through the technical solutions as mentioned above, a substantial improvement in the technology, and also the value of extensive use in the industry, are achieved. There is at least the following advantage: since the coolant in the first coolant channel can be directly in contact with the base plate convex hull, when the converter module located in the concave recess operates, the heat generated can be effectively delivered away by the coolant though the base plate convex hull, consequently the power conversion device has a good rate of heat dissipation.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A power conversion device, comprising:
   a casing comprising a base plate and a side wall, the base plate and the side wall forming a chamber;
   a structural plate located in the chamber;
   a converter module located between the base plate and the structural plate;
   an auxiliary circuit board module located at a side of the structural plate in the chamber away from the base plate, and electrically connected with the converter module;
   a top cover sealing the chamber;
   at least one strut comprising:
      an insulating column, an end of the insulating column being connected with the base plate;
      at least one terminal located at another end of the insulating column; and
      at least one connecting piece electrically connected with the terminal; and
   at least one fastener fastening together the connecting piece, the terminal and the insulating column.

2. The power conversion device of claim 1, wherein the converter module comprises a plurality of converters.

3. The power conversion device of claim 2, wherein each of the converters has a loading capacity; and the auxiliary circuit board module comprises:
an output board configured to sum up the loading capacity of at least one of the converters into a loading capacity of the power conversion device.

4. The power conversion device of claim 2, wherein the phase of a voltage of an alternative current of an input side of each of the converters is different from each other.

5. The power conversion device of claim 2, wherein the phase of a voltage of an alternative current of an input side of each of the converters is the same as each other.

6. The power conversion device of claim 1, wherein the auxiliary circuit board module comprises an electromagnetic interference control board.

7. The power conversion device of claim 1, wherein the base plate comprises an accommodation space, each of the converters comprises a magnetic element and a printed circuit board, each of the magnetic elements is electrically connected to the corresponding printed circuit board, each of the magnetic elements is located between the corresponding printed circuit board and the base plate, and each of the magnetic elements is fixed in the accommodation space.

8. The power conversion device of claim 1, wherein
another end of the insulating column supports the converter module,
the terminal locates between the insulating column and the converter module, the converter module has at least one connecting end, the connecting end electrically connects with the terminal,
the fastener fastens together the converter module, the terminal and the insulating column.

9. The power conversion device of claim 1, wherein the converter module and the auxiliary circuit board module are disposed back to back.

10. The power conversion device of claim 9, wherein the auxiliary circuit board module comprises:
at least one printed circuit board; and
at least one electronic element arranged on the printed circuit board, and the electronic element is located between the printed circuit board and the top cover.

11. The power conversion device of claim 9, wherein the converter module comprises:
at least one printed circuit board; and
at least one electronic element arranged on the printed circuit board, and the electronic element is located between the printed circuit board and the base plate.

12. The power conversion device of claim 11, wherein the converter module further comprises a secondary side rectifier diode, the secondary side rectifier diode is arranged on the printed circuit board, and the secondary side rectifier diode is located between the printed circuit board and the base plate.

13. The power conversion device of claim 11, wherein the converter module further comprises a magnetic element electrically connected with the printed circuit board, and the magnetic element is located between the printed circuit board and the base plate.

14. The power conversion device of claim 1, wherein the structural plate is of a metallic material.

15. The power conversion device of claim 14, wherein two sides of the structural plate are affixed with insulating material.

* * * * *